(12) United States Patent
Goto et al.

(10) Patent No.: US 10,692,903 B2
(45) Date of Patent: Jun. 23, 2020

(54) COLOR FILTER FOR IMAGE SENSOR, IMAGE SENSOR, AND METHOD OF MANUFACTURING COLOR FILTER FOR IMAGE SENSOR

(71) Applicant: FUJIFILM Corporation, Tokyo (JP)

(72) Inventors: Ryoji Goto, Kanagawa (JP); Kazuto Shimada, Kanagawa (JP); Shigeaki Nimura, Kanagawa (JP)

(73) Assignee: FUJIFILM Corporation, Tokyo (JP)

( * ) Notice: Subject to any disclaimer, the term of this patent is extended or adjusted under 35 U.S.C. 154(b) by 53 days.

(21) Appl. No.: 16/214,152

(22) Filed: Dec. 10, 2018

(65) Prior Publication Data

US 2019/0109161 A1 Apr. 11, 2019

Related U.S. Application Data

(63) Continuation of application No. PCT/JP2017/022944, filed on Jun. 22, 2017.

(30) Foreign Application Priority Data

Jul. 1, 2016 (JP) ................................. 2016-131980
Aug. 29, 2016 (JP) ................................. 2016-166834

(51) Int. Cl.
*H01L 27/146* (2006.01)
*G02B 1/11* (2015.01)
(Continued)

(52) U.S. Cl.
CPC ............ *H01L 27/1461* (2013.01); *G02B 1/11* (2013.01); *G02B 3/00* (2013.01); *G02B 5/20* (2013.01);
(Continued)

(58) Field of Classification Search
CPC .................. H01L 27/1461; H04N 9/04511
(Continued)

(56) References Cited

U.S. PATENT DOCUMENTS 5,071,229 A * 12/1991 Oaki ........................ G02B 3/08
349/200
5,150,234 A * 9/1992 Takahashi ................. G02F 1/29
349/1

(Continued)

FOREIGN PATENT DOCUMENTS

JP S6132801 2/1986
JP 2000258760 9/2000
(Continued)

OTHER PUBLICATIONS

"International Preliminary Report on Patentability (Form PCT/IPEA/409) of PCT/JP2017/022944," completed on Mar. 26, 2018, with English translation thereof, pp. 1-16.
(Continued)

*Primary Examiner* — Igwe U Anya
(74) *Attorney, Agent, or Firm* — JCIPRNET

(57) ABSTRACT

Provided are: a color filter for an image sensor in which an infrared filter having no particulate defects or the like can be laminated adjacent to an image pickup element and in which the total thickness of an image sensor can be significantly reduced; an image sensor including the color filter for an image sensor; and a method of manufacturing the color filter for an image sensor. The color filter for an image sensor includes: two or more absorbing color filters that absorb light components having different wavelength ranges; and a cholesteric reflecting layer in which a right circularly polarized light cholesteric layer having right circularly polarized light reflecting properties and a left circularly polarized light
(Continued)

cholesteric layer having left circularly polarized light reflecting properties are laminated.

20 Claims, 3 Drawing Sheets

(51) Int. Cl.
  G02B 5/22  (2006.01)
  G02B 5/26  (2006.01)
  G02B 5/30  (2006.01)
  G02B 5/20  (2006.01)
  G02B 3/00  (2006.01)
  H04N 9/04  (2006.01)
  H04N 5/33  (2006.01)

(52) U.S. Cl.
  CPC .............. *G02B 5/208* (2013.01); *G02B 5/22* (2013.01); *G02B 5/26* (2013.01); *G02B 5/30* (2013.01); *H01L 27/146* (2013.01); *H01L 27/1462* (2013.01); *H01L 27/14621* (2013.01); *H01L 27/14629* (2013.01); *H01L 27/14645* (2013.01); *H01L 27/14685* (2013.01); *H04N 5/33* (2013.01); *H04N 9/04511* (2018.08); *H01L 27/14627* (2013.01)

(58) Field of Classification Search
  USPC ........................................................ 257/432
  See application file for complete search history.

(56) References Cited

U.S. PATENT DOCUMENTS

| | | |
|---|---|---|
| 6,693,688 B1 | 2/2004 | Hisatake et al. |
| 2015/0331163 A1 | 11/2015 | Iwasaki et al. |
| 2016/0170262 A1* | 6/2016 | Saneto ............... G02B 5/26 |
| | | 349/71 |
| 2016/0349573 A1* | 12/2016 | Ohmuro ............ G02F 1/1336 |
| 2017/0108726 A1* | 4/2017 | Yanai ............... G02F 1/13362 |

FOREIGN PATENT DOCUMENTS

| | | |
|---|---|---|
| JP | 2005031170 | 2/2005 |
| JP | 2013041141 | 2/2013 |
| WO | 2014061188 | 4/2014 |

OTHER PUBLICATIONS

"International Search Report (Form PCT/ISA/210) of PCT/JP2017/022944," dated Sep. 19, 2017, with English translation thereof, pp. 1-5.

* cited by examiner

COLOR FILTER FOR IMAGE SENSOR, IMAGE SENSOR, AND METHOD OF MANUFACTURING COLOR FILTER FOR IMAGE SENSOR

CROSS-REFERENCE TO RELATED APPLICATIONS

This application is a Continuation of PCT International Application No. PCT/JP2017/022944 filed on Jun. 22, 2017, which claims priority under 35 U.S.C. § 119(a) to Japanese Patent Application No. 2016-131980 filed on Jul. 1, 2016 and Japanese Patent Application No. 2016-166834 filed on Aug. 29, 2016. Each of the above applications is hereby expressly incorporated by reference, in its entirety, into the present application.

BACKGROUND OF THE INVENTION

1. Field of the Invention

The present invention relates to a color filter for an image sensor used for an image sensor, an image sensor including this color filter for an image sensor, and a method of manufacturing the color filter for an image sensor.

2. Description of the Related Art

Recently, various image sensors including a solid image pickup element such as photodiode are used.

In order to obtain a color image using an image sensor, in general, color filters of three primary colors including red (R), green (G), and blue (B) are used. That is, in the image sensor, color filters absorb respective color components from incidence light such that only red light, green light, and blue light are extracted from the incidence light. The extracted red, green, and blue light components are caused to be incident on a solid image pickup element to measure the respective light components. As a result, a color image is obtained.

However, many solid image pickup elements have sensitivity to infrared light in addition to red light, green light, and blue light (visible light). In addition, a general color filter does not absorb infrared light.

Therefore, in an image sensor including color filters of three primary colors, infrared light is also incident on a solid image pickup element and measured as a light component of each color.

This infrared light component becomes noise to appropriate red light, green light, and blue light, which causes image quality deterioration of an image obtained by the image sensor.

Therefore, in the image sensor, an infrared filter that blocks (cuts) infrared light is provided to remove noise generated by infrared light.

In general, an infrared filter has a configuration in which a layer formed of a material that absorbs infrared light or a multi-layer film that reflects infrared light using interference is provided on a surface (main surface) of a substrate such as glass or a film.

This infrared filter is typically provided between an optical system for imaging and an image sensor.

However, recently, a reduction in the thickness of an imaging device that is provided in a digital camera, a smartphone, or the like is required. However, the infrared filter that is provided between the optical system for imaging and the image sensor is a factor that inhibits a reduction in the thickness of an imaging device.

On the other hand, WO2014/061188A discloses an image sensor (solid image pickup element) including: an on-chip lens that is formed of a high refractive index material; a low refractive index layer that is formed of a low refractive index material and is formed flat on the on-chip lens; and an infrared absorbing layer that is formed of an infrared absorbing material and is formed above the low refractive index layer, and optionally further including a multi-layer film infrared reflecting layer that is formed of a multi-layer film including a layer formed of a high refractive index material and a layer formed of a low refractive index material.

SUMMARY OF THE INVENTION

According to the image sensor described in WO2014/061188A, the infrared filter is directly formed on the image sensor, and thus the height of an imaging device can be reduced.

However, according to an investigation by the present inventors, in this image sensor, a multi-layer film infrared reflecting layer that is formed of a multi-layer film including a layer formed of a high refractive index material and a layer formed of a low refractive index material is formed by vapor deposition of inorganic materials. Therefore, a coarse particulate defect may be formed in the multi-layer film infrared reflecting layer.

In a case where the multi-layer film infrared reflecting layer is provided adjacent to a solid image pickup element, this defect causes significant deterioration in image quality, and thus it is necessary that the multi-layer film infrared reflecting layer is provided at a given distance from a pixel of the solid image pickup elements. As a result, the thickness of the image sensor increases.

In addition, a device for manufacturing the solid image pickup element has a configuration different from that of device for manufacturing the multi-layer film. Therefore, in order to directly prepare the multi-layer film infrared reflecting layer on the solid image pickup element, significant improvement of facilities or a complex step such as a step of separately manufacturing the components and transferring the manufactured components is necessary.

Further, it is known that a phenomenon called flaring or ghosting that occurs in a case where strong light such as sunlight is incident is caused by multiple reflection of light between an infrared filter and an image sensor (on-chip lens).

An object of the present invention is to solve the above-described problem of the related art and is to provide: a color filter for an image sensor in which an infrared filter can be provided adjacent to a solid image pickup element to block infrared light without forming a particulate defect or the like and in which the height of an imaging device that is provided in a smartphone or the like can be reduced (reduction in thickness); an image sensor including the color filter for an image sensor; and a method of manufacturing the color filter for an image sensor.

In order to solve the problem, according to the present invention, there is provided a color filter for an image sensor comprising:

two or more absorbing color filters that absorb light components having different wavelength ranges; and a cholesteric reflecting layer that is laminated on the absorbing color filters and in which a right circularly polarized light cholesteric layer having right circularly polarized light reflecting properties and a left circularly polarized light cholesteric layer having left circularly polarized light reflecting properties are laminated.

In the color filter for an image sensor according to the present invention, it is preferable that a gap between the absorbing color filters and the cholesteric reflecting layer is 100 μm or less.

In addition, it is preferable that a microlens is provided between the absorbing color filters and the cholesteric reflecting layer.

In addition, it is preferable that covers the microlens to planarize a surface of the microlens is provided between the microlens and the cholesteric layer.

In addition, it is preferable that the color filter for an image sensor further comprises a near infrared absorbing layer having absorption properties in a near infrared range.

In addition, it is preferable that an antireflection layer is provided at an interface in contact with air.

In addition, it is preferable that an aligned cholesteric layer is provided at an interface in contact with the cholesteric reflecting layer.

In addition, it is preferable that the aligned cholesteric layer is a photo-aligned film.

In addition, it is preferable that, in a plane of the right circularly polarized light cholesteric layer and the left circularly polarized light cholesteric layer of the cholesteric reflecting layer, a plurality of reflecting regions that reflect light components having different wavelength ranges are provided, and reflecting regions that reflect light components having the same wavelength range are laminated at the same position in a plane direction.

In addition, it is preferable that the right circularly polarized light cholesteric layer and the left circularly polarized light cholesteric layer of the cholesteric reflecting layer are formed by curing a polymerizable cholesteric liquid crystal composition.

In addition, it is preferable that the polymerizable cholesteric liquid crystal composition includes at least one polymerizable liquid crystal having a refractive index anisotropy Δn of 0.2 or higher, at least one chiral agent that induces right or left twisting, and a polymerization initiator.

In addition, it is preferable that a substrate is provided on a surface of the cholesteric reflecting layer opposite to the absorbing color filters.

In addition, according to the present invention, there is provided an image sensor comprising:
the color filter for an image sensor according to the present invention; and
a sensor including solid image pickup elements that are arranged in a two-dimensional matrix.

In addition, there is provided a first aspect of a method of manufacturing a color filter for an image sensor according to the present invention, the method comprising:
a filter forming step of forming two or more absorbing color filters that absorb light components having different wavelength ranges on a sensor including solid image pickup elements that are arranged in a two-dimensional matrix; and
a cholesteric reflecting layer forming step of forming a cholesteric reflecting layer in which a right circularly polarized light cholesteric layer having right circularly polarized light reflecting properties and a left circularly polarized light cholesteric layer having left circularly polarized light reflecting properties are laminated, the cholesteric reflecting layer forming step including a step of forming the right circularly polarized light cholesteric layer and a step of forming the left circularly polarized light cholesteric layer.

In the first aspect of the method of manufacturing a color filter for an image sensor according to the present invention, it is preferable that a microlens forming step of forming a microlens corresponding to a pixel of the solid image pickup elements and a planarizing layer forming step of forming a planarizing layer that covers the microlens to planarize a surface of the microlens are provided between the filter forming step and the cholesteric reflecting layer forming step.

In addition, it is preferable that the step of forming the right circularly polarized light cholesteric layer in the cholesteric reflecting layer forming step includes a step of applying a polymerizable cholesteric liquid crystal composition including a chiral agent that induces right twisting, a step of heating the polymerizable cholesteric liquid crystal composition to form a cholesteric liquid crystalline phase having right circularly polarized light reflecting properties, and a step of exposing the cholesteric liquid crystalline phase to ultraviolet light to immobilize the cholesteric liquid crystalline phase, and it is preferable that the step of forming the left circularly polarized light cholesteric layer in the cholesteric reflecting layer forming step includes a step of applying a polymerizable cholesteric liquid crystal composition including a chiral agent that induces left twisting, a step of heating the polymerizable cholesteric liquid crystal composition to form a cholesteric liquid crystalline phase having left circularly polarized light reflecting properties, and a step of exposing the cholesteric liquid crystalline phase to ultraviolet light to immobilize the cholesteric liquid crystalline phase.

In addition, it is preferable that the first aspect of the method of manufacturing a color filter for an image sensor according to the present invention further comprises an aligned layer forming step of forming an aligned cholesteric layer on a surface on which the cholesteric reflecting layer is to be formed.

In addition, it is preferable that the aligned cholesteric layer is a photo-aligned film, and the aligned layer forming step includes a step of forming a photo-aligned film and a step of irradiating the photo-aligned film with polarized light to impart an alignment restriction force.

In addition, it is preferable that an antireflection layer forming step of forming an antireflection layer is provided after the cholesteric reflecting layer forming step.

In addition, it is preferable that an infrared absorbing layer forming step of forming a near infrared absorbing layer having absorption properties in a near infrared range is provided after the filter forming step.

Further, it is preferable that, before at least one forming step among the respective forming steps, at least one treatment step among a bashing treatment step of performing a bashing treatment on a surface on which the forming step is to be performed using an organic solvent, a plasma treatment step of performing a plasma treatment on a surface on which the forming step is to be performed, and a saponification treatment step of performing a saponification treatment on a surface on which the forming step is to be performed using an alkaline solution is performed.

In addition, there is provided a second aspect of a method of manufacturing a color filter for an image sensor according to the present invention, the method comprising:
a filter forming step of forming two or more absorbing color filters that absorb light components having different wavelength ranges on a sensor including solid image pickup elements that are arranged in a two-dimensional matrix;

a cholesteric reflecting layer forming step of forming a cholesteric reflecting layer in which a right circularly polarized light cholesteric layer having right circularly polarized light reflecting properties and a left circularly polarized light cholesteric layer having left circularly polarized light reflecting properties are laminated on one surface of a substrate; and a bonding step of laminating and bonding the sensor and the substrate to each other such that the absorbing color filters and the cholesteric reflecting layer face each other.

In the second aspect of the method of manufacturing a color filter for an image sensor according to the present invention, it is preferable that, in the bonding step, the solid image pickup element and the substrate are bonded to each other such that a distance between the cholesteric reflecting layer and the absorbing color filters is 100 μm or less.

In addition, it is preferable that a microlens forming step of forming a microlens corresponding to a pixel of the solid image pickup elements is provided after the filter forming step.

In addition, it is preferable that a bonding layer forming step of forming a bonding layer that covers the microlens to planarize a surface of the microlens and bonds the solid image pickup element and the substrate to each other is provided after the microlens forming step.

Further, it is preferable that a removing step of removing the substrate is provided after the bonding step.

According to the present invention, an infrared filter having no particulate defects or the like can be laminated adjacent to an image pickup element, and the height (thickness) of an imaging device (imaging module) that is provided in a digital camera, a smartphone, or the like can be significantly reduced.

Further, according to the present invention, an infrared filter that blocks infrared light is provided adjacent to a solid image pickup element such that the occurrence of flaring and ghosting can be suppressed.

DESCRIPTION OF THE PREFERRED EMBODIMENTS

Hereinafter, a color filter for an image sensor, an image sensor, and a method of manufacturing a color filter for an image sensor according to the embodiment of the present invention will be described in detail using a preferable embodiment shown in the accompanying drawings.

In the present invention, numerical ranges represented by "to" include numerical values before and after "to" as lower limit values and upper limit values.

Unless specified otherwise, the meaning of "angle" or like includes a case where an error range is generally allowable in the technical field.

In this present invention, "(meth)acrylate" represents "either or both of acrylate and methacrylate".

In the present invention, visible light refers to light which can be observed by human eyes among electromagnetic waves and refers to light in a wavelength range of 380 to 780 nm Invisible light refers to light in a wavelength range of shorter than 380 nm or longer than 780 nm.

In addition, although not limited thereto, in visible light, light in a wavelength range of 420 to 490 nm refers to blue light (B), light in a wavelength range of 495 to 570 nm refers to green light (G), and light in a wavelength range of 620 to 750 nm refers to red light (R).

Further, in the present invention, infrared light (infrared ray) refers to light in a wavelength range of longer than 780 nm and 1 mm or shorter. In particular, a near infrared light refers to light in a wavelength range of longer than 780 nm and 2000 nm or shorter.

Figure 1:
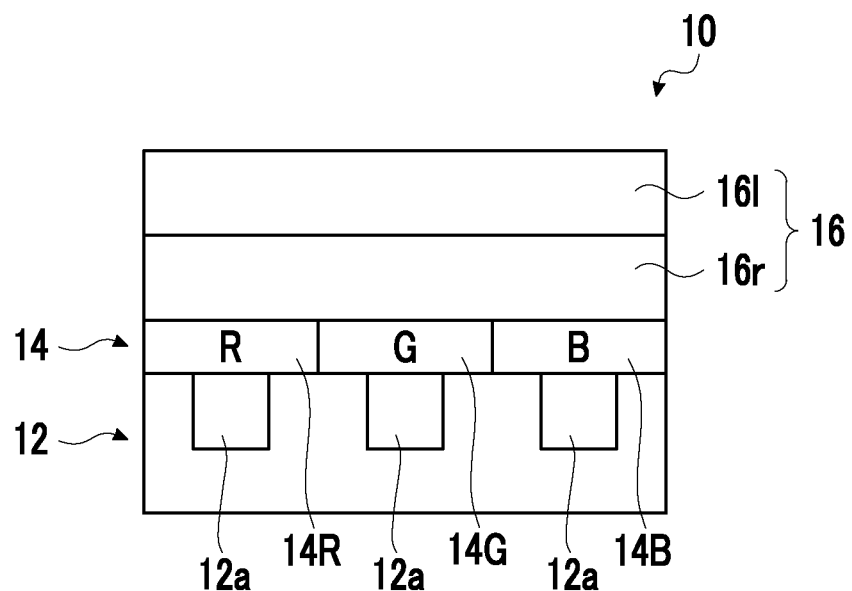
FIG. 1 is a diagram conceptually showing an example of an image sensor according to an embodiment of the present invention including an example of a color filter for an image sensor according to an embodiment of the present invention.

FIG. 1 is a diagram conceptually showing an example of an image sensor according to an embodiment of the present invention including an example of a color filter for an image sensor according to an embodiment of the present invention.

An image sensor 10 shown in FIG. 1 includes a sensor main body 12, an absorbing color filter 14, and a cholesteric reflecting layer 16. In addition, in FIG. 1, the color filter for an image sensor according to the embodiment of the present invention includes the absorbing color filter 14 and the cholesteric reflecting layer 16.

In the following description, "color filter for an image sensor" according to the embodiment of the present invention will also simply referred to as "color filter".

The sensor main body 12 includes a solid image pickup element 12a. The absorbing color filter 14 includes a red filter 14R, a green filter 14G, and a blue filter 14B. The cholesteric reflecting layer 16 includes a right circularly polarized light cholesteric layer 16r and a left circularly polarized light cholesteric layer 16l.

In the example shown in FIG. 1, the sensor main body 12 includes only three solid image pickup elements 12a, and the absorbing color filter 14 includes only one red filter 14R, only one green filter 14G, and only one blue filter 14B corresponding to the three solid image pickup elements 12a. However, actually, a plurality of solid image pickup elements 12a are two-dimensionally arranged. In addition, actually, a plurality of red filters 14R, a plurality of green filters 14G, and a plurality of blue filters 14B are repeatedly formed, for example, in a Bayer array.

As described above, the sensor main body 12 includes the solid image pickup element 12a.

In general, the sensor main body 12 is a well-known sensor main body called a charge coupled device (CCD) or a complementary metal oxide semiconductor (CMOS) included in the solid image pickup element 12a such as a photodiode.

The solid image pickup element 12a detects light and functions as a light-receiving element. For detection of light, for example, photoelectric conversion is used. In the sensor main body 12, a plurality of solid image pickup elements 12a are two-dimensionally are disposed, and a predetermined number of solid image pickup elements 12a constitute one pixel. The solid image pickup element 12a is formed of, for example, silicon or germanium.

The solid image pickup element 12a is not particularly limited as long as it can detect light. For example, any one of a PN junction type, a p-intrinsic-n (PIN) junction type, a Schottky type, or an avalanche type can be used.

In addition to the above-described components, the sensor main body 12 includes various well-known members which may be included in a well-known optical sensor called a CCD sensor or a CMOS sensor, for example, a substrate such as a silicon substrate, a wiring member for outputting a signal charge obtained from the solid image pickup element 12a to an external device, and a light shielding layer formed of a metal film for preventing light having passed through various color filters from being incident on the solid image pickup element 12a adjacent thereto, or an insulating layer constituting boron phosphorus silicon glass (BPSG).

On a light receiving surface of the sensor main body 12, the absorbing color filter 14 is provided.

The absorbing color filter 14 includes the red filter 14R, the green filter 14G, and the blue filter 14B, in which any one of the red filter 14R, the green filter 14G or the blue filter 14B is provided corresponding to one solid image pickup element 12a of the sensor main body 12.

The absorbing color filter 14 is a well-known three primary color absorbing color filter used in a CCD sensor or the like.

That is, the red filter 14R allows transmission of red light and absorbs visible light other than red light. The green filter 14G allows transmission of green light and absorbs visible light other than green light. The blue filter 14B allows transmission of blue light and absorbs visible light other than blue light.

As the absorbing color filter 14, a color filter of a color other than red, green, and blue may be used. For example, as the absorbing color filter 14, a complementary color filter having transmitted light spectra in cyan, magenta, and yellow regions, or a visible cut filter that cuts visible light and allows transmission of near infrared light can also be used.

Further, as the absorbing color filter 14, two or more selected from red, green, and blue color filters, a complementary color filter, and a visible cut filter may be used in combination.

On the absorbing color filter 14, that is, on a surface of the absorbing color filter 14 opposite to the sensor main body 12, the cholesteric reflecting layer 16 is provided. In the following description, "upper side" refers to the upper side in the drawing. That is, the sensor main body 12 side refers to "lower side".

As described above, the cholesteric reflecting layer 16 includes the right circularly polarized light cholesteric layer 16r and the left circularly polarized light cholesteric layer 16l. Both the right circularly polarized light cholesteric layer 16r and the left circularly polarized light cholesteric layer 16l are obtained by immobilizing a cholesteric liquid crystalline phase and have wavelength selective reflecting properties.

As described above, both the right circularly polarized light cholesteric layer 16r and the left circularly polarized light cholesteric layer 16l are layers obtained by immobilizing a cholesteric liquid crystalline phase. The cholesteric liquid crystalline phase has wavelength selective reflecting properties in which selective reflecting properties are exhibited at a specific wavelength.

A center wavelength $\lambda$ of the selective reflection of the cholesteric liquid crystalline phase depends on a pitch P (=helical cycle) of a helical structure in the cholesteric liquid crystalline phase and complies with an average refractive index n of the cholesteric liquid crystalline phase and a relationship of $\lambda = n \times P$. Therefore, the selective reflection wavelength can be adjusted by adjusting the pitch of the helical structure. The pitch of the cholesteric liquid crystalline phase depends on the kind of a chiral agent which is used in combination of a polymerizable liquid crystal compound, or the concentration of the chiral agent added. Therefore, a desired pitch can be obtained by adjusting the kind and concentration of the chiral agent.

In addition, a full width at half maximum $\Delta\lambda$ (nm) of a selective reflection range (circularly polarized light reflection range) where selective reflection is exhibited depends on a refractive index anisotropy $\Delta n$ of the cholesteric liquid crystalline phase and the helical pitch P and complies with a relationship of $\Delta\lambda = \Delta n \times P$. Therefore, the width of the selective reflection range can be controlled by adjusting the refractive index anisotropy $\Delta n$ of the cholesteric liquid crystalline phase. The refractive index anisotropy $\Delta n$ can be adjusted by adjusting the kinds of liquid crystal compounds for forming the right circularly polarized light cholesteric layer 16r and the left circularly polarized light cholesteric layer 16l and a mixing ratio thereof, and a temperature during alignment immobilization.

As a method of measuring a helical sense and a helical pitch, a method described in "Introduction to Experimental Liquid Crystal Chemistry", (the Japanese Liquid Crystal Society, 2007, Sigma Publishing Co., Ltd.), p. 46, and "Liquid Crystal Handbook" (the Editing Committee of Liquid Crystal Handbook, Maruzen Publishing Co., Ltd.), p. 196 can be used.

Reflected light of the cholesteric liquid crystalline phase is circularly polarized light. Whether or not the reflected circularly polarized light is right circularly polarized light or left circularly polarized light is determined depending on a helical twisting direction of the cholesteric liquid crystalline phase. Regarding the selective reflection of the circularly polarized light by the cholesteric liquid crystalline phase, in a case where the helical twisting direction of the cholesteric liquid crystalline phase is right, right circularly polarized light is reflected, and in a case where the helical twisting direction of the cholesteric liquid crystalline phase is left, left circularly polarized light is reflected.

Accordingly, in the cholesteric reflecting layer 16, the right circularly polarized light cholesteric layer 16r is a layer obtained by immobilizing a right-twisted cholesteric liquid crystalline phase, and the left circularly polarized light cholesteric layer 16l is a layer obtained by immobilizing a left-twisted cholesteric liquid crystalline phase.

A direction of rotation of the cholesteric liquid crystalline phase can be adjusted by adjusting the kinds of liquid crystal compounds for forming the right circularly polarized light cholesteric layer 16r and the left circularly polarized light cholesteric layer 16l and/or the kind of a chiral agent to be added.

The right circularly polarized light cholesteric layer 16r and/or the left circularly polarized light cholesteric layer 16l may have a single-layer structure or a multi-layer structure.

A wavelength range of light to be reflected, that is, a wavelength range of light to be blocked can be widened by sequentially laminating layers in which the center wavelength λ of selective reflection is shifted. In addition, as a method of changing a helical pitch in a layer stepwise that is called a pitch gradient method, a technique of widening a wavelength range is also known, and specific examples thereof include methods described in Nature 378, 467-469 (1995), JP1994-281814A (JP-H6-281814A), and JP4990426B.

Reflection wavelength ranges of the right circularly polarized light cholesteric layer 16*r* and the left circularly polarized light cholesteric layer 16*l* according to the embodiment of the present invention can be set to be in any one of a visible range (about 380 to 780 nm) or a near infrared range (about 780 to 2000 nm), and a setting method thereof is as described above.

In a case where a cholesteric layer is used as an infrared filter, it is necessary to cover a range up to 1200 nm that is a sensitivity range of a general silicon photodiode. The lower limit of the wavelength is determined based on a relationship with a blocking wavelength range of the absorbing color filter and is generally about 700 to 800 nm.

As in the case of the multi-layer film infrared reflecting layer formed of inorganic materials, a reflection type filter formed of a cholesteric layer has angle dependence of the reflection wavelength, and as the incidence angle of incidence light becomes shallow, the wavelength of reflection decreases. That is, as the lower limit value of the reflection wavelength is set to be lower, coloring (redness) with respect to oblique light becomes significant, and thus it is necessary to make an optical design in consideration of the effect of the coloring. In order to avoid the problem of the coloring with respect to oblique light, it is effective to use the cholesteric reflecting layer 16 in combination with an infrared absorbing layer 34 described below, and it is desirable to make design in which the infrared absorbing layer 34 having no angle dependence is set on a short wavelength side and the cholesteric reflecting layer covers a long wavelength side. In addition, the cholesteric reflecting layer 16 is also applicable to a selective wavelength filter that allows or blocks transmission of only near infrared light at a specific wavelength.

For example, the image sensor 10 may be prepared using a method including: forming the absorbing color filter 14 including the red filter 14R, the green filter 14G, and the blue filter 14B on a light incident surface of the sensor main body 12 (filter forming step); and forming the cholesteric reflecting layer 16 by forming the right circularly polarized light cholesteric layer 16*r* on the absorbing color filter 14 and forming the left circularly polarized light cholesteric layer 16*l* on the right circularly polarized light cholesteric layer 16*r* (cholesteric reflecting layer forming step).

The order of formation of the right circularly polarized light cholesteric layer 16*r* and the left circularly polarized light cholesteric layer 16*l* may be reversed. That is, the image sensor 10 may have a configuration in which the left circularly polarized light cholesteric layer 16*l* is provided on the absorbing color filter 14 side as the lower layer and the right circularly polarized light cholesteric layer 16*r* is provided on the left circularly polarized light cholesteric layer 16*l*. Regarding this point, the same shall be applied to other image sensors.

Further, instead of directly forming the cholesteric reflecting layer 16 on the surface of the absorbing color filter 14 (surface on which the cholesteric reflecting layer 16 is to be formed), a configuration of forming the right circularly polarized light cholesteric layer 16*r* and/or the left circularly polarized light cholesteric layer 16*l* on a substrate such as a glass substrate and laminating this substrate on the absorbing color filter 14 may be adopted. In this case, the cholesteric reflecting layer 16 may be formed by forming the right circularly polarized light cholesteric layer 16*r* and the left circularly polarized light cholesteric layer 16*l* on one substrate, or the cholesteric reflecting layer 16 may be formed by forming the right circularly polarized light cholesteric layer 16*r* on one substrate, forming the left circularly polarized light cholesteric layer 16*l* on another substrate, and laminating these substrates.

The configuration using the substrate may be used even in a case where a plurality of right circularly polarized light cholesteric layers 16*r* and/or a plurality of left circularly polarized light cholesteric layers 16*l*. In a case where a cholesteric layer having a multi-layer configuration is formed using a substrate, the right circularly polarized light cholesteric layers 16*r* and/or the left circularly polarized light cholesteric layers 16*l* may be formed by forming a plurality of cholesteric layers on one substrate. The right circularly polarized light cholesteric layer 16*r* and/or the left circularly polarized light cholesteric layer 16*l* may be formed by laminating one cholesteric layer or a plurality of cholesteric layers on one substrate and laminating a plurality of the substrates.

This configuration using the substrate may be used to form a layer other than the cholesteric reflecting layer 16.

As the substrate, for example, various substrates described below as examples of a substrate 42 may be used.

In addition, it is preferable that, before at least one formation (forming step) among the formation of the absorbing color filter 14 (filter forming step) and the formation of the cholesteric reflecting layer 16, that is, the formation of the right circularly polarized light cholesteric layer 16*r* and the formation of the left circularly polarized light cholesteric layer 16*l* (cholesteric reflecting layer forming step), at least one treatment (treatment step) among a bashing treatment (bashing treatment step) using an organic solvent, a plasma treatment (plasma treatment step), and a saponification treatment using an alkaline solution (saponification treatment step) is performed on a surface on which the cholesteric layer or the like is to be formed (surface on which the forming step is to be performed).

In addition to the formation of the absorbing color filter 14 and/or the formation of the cholesteric reflecting layer 16, it is preferable that, before at least one formation among the formation of a microlens 24 (microlens forming step), the formation of a planarizing layer 26 (planarizing layer forming step), the formation of an aligned cholesteric layer 32 (aligned layer forming step), the formation of the infrared absorbing layer 34 (infrared absorbing layer forming step), and the formation of an antireflection layer 36 (antireflection layer forming step) described below, at least one treatment among the bashing treatment using an organic solvent, the plasma treatment, and the saponification treatment using an alkaline solution is performed on a surface on which the cholesteric layer or the like is to be formed.

Further, one or more treatment among the bashing treatment, the plasma treatment, and the saponification treatment may be optionally performed on a surface of the substrate 42 described below.

In a case where any layer is formed using a coating method, and in a case where a coating solution (coating composition) for forming the layer includes a fluorine-based cissing inhibitor and/or an interface alignment agent, the fluorine material may be unevenly distributed on a surface the formed layer. In a case where a coating solution is applied to the formed surface (coated surface) to further form another layer on the surface of the layer using a coating method, cissing is likely to occur in the coating solution, and an appropriate layer may not be formed.

In order to prevent this problem, in general, it is necessary that a surface energy of the coating solution is higher than a surface energy of the surface where the layer is formed, that is, the coated surface.

On the other hand, by performing the bashing treatment on the surface where the layer is to be formed before the formation of the layer, the fluorine material may be removed from the surface where the layer is to be formed such that the surface energy increases. As a result, the coating solution is appropriately applied to the surface where the layer is to be formed such that an appropriate layer can be formed.

Any treatment among the bashing treatment using an organic solvent, the plasma treatment, and the saponification treatment may be performed using a well-known method according to the surface where the layer is to be formed and/or a material or the like of the material.

The formation of the absorbing color filter 14 may be performed using a well-known method that is performed using a CCD sensor or a CMOS sensor.

On the other hand, the formation of the right circularly polarized light cholesteric layer 16r and the left circularly polarized light cholesteric layer 16l may be performed, for example, using the following method.

In the following description, in a case where it is not necessary to distinguish the right circularly polarized light cholesteric layer 16r and the left circularly polarized light cholesteric layer 16l from each other, the right circularly polarized light cholesteric layer 16r and the left circularly polarized light cholesteric layer 16l will also be collectively referred to as "cholesteric liquid crystal layer".

The cholesteric liquid crystal layer can be obtained by immobilizing a cholesteric liquid crystalline phase.

The structure in which a cholesteric liquid crystalline phase is immobilized may be a structure in which the alignment of the liquid crystal compound as a cholesteric liquid crystalline phase is immobilized. Typically, the structure in which a cholesteric liquid crystalline phase is immobilized may be a structure which is obtained by making the polymerizable liquid crystal compound to be in a state where a cholesteric liquid crystalline phase is aligned, polymerizing and curing the polymerizable liquid crystal compound with ultraviolet irradiation, heating, or the like to form a layer having no fluidity, and concurrently changing the state of the polymerizable liquid crystal compound into a state where the aligned state is not changed by an external field or an external force.

The structure in which a cholesteric liquid crystalline phase is immobilized is not particularly limited as long as the optical characteristics of the cholesteric liquid crystalline phase are maintained, and the liquid crystal compound does not necessarily exhibit liquid crystallinity. For example, the molecular weight of the polymerizable liquid crystal compound may be increased by a curing reaction such that the liquid crystallinity thereof is lost.

Examples of a material used for forming the cholesteric liquid crystal layer obtained by immobilizing a cholesteric liquid crystalline phase include a liquid crystal composition including a liquid crystal compound. It is preferable that the liquid crystal compound is a polymerizable liquid crystal compound.

It is preferable that the liquid crystal composition including a liquid crystal compound for forming the cholesteric liquid crystal layer further includes a surfactant. In addition, the liquid crystal composition used for forming the cholesteric liquid crystal layer may further include a chiral agent and a polymerization initiator.

In particular, it is preferable that the liquid crystal composition for forming the right circularly polarized light cholesteric layer 16r is a polymerizable cholesteric liquid crystal composition including a polymerizable liquid crystal compound and a chiral agent that induces right twisting and optionally further including a polymerization initiator. In addition, it is preferable that the liquid crystal composition for forming the left circularly polarized light cholesteric layer 16l is a polymerizable cholesteric liquid crystal composition including a polymerizable liquid crystal compound and a chiral agent that induces left twisting and optionally further including a polymerization initiator.

It is preferable that the polymerizable cholesteric liquid crystal composition includes one or more polymerizable liquid crystal compounds having a refractive index anisotropy $\Delta n$ of 0.2 or higher.

—Polymerizable Liquid Crystal Compound—

The polymerizable liquid crystal compound may be a rod-shaped liquid crystal compound or a disk-shaped liquid crystal compound and is preferably a rod-shaped liquid crystal compound.

Examples of the rod-shaped polymerizable liquid crystal compound for forming the cholesteric liquid crystalline phase include a rod-shaped nematic liquid crystal compound. As the rod-shaped nematic liquid crystal compound, an azomethine compound, an azoxy compound, a cyanophenyl compound, a cyanophenyl ester compound, a benzoate compound, a phenyl cyclohexanecarboxylate compound, a cyanophenylcyclohexane compound, a cyano-substituted phenylpyrimidine compound, an alkoxy-substituted phenylpyrimidine compound, a phenyldioxane compound, a tolan compound, or an alkenylcyclohexylbenzonitrile compound is preferably used. Not only a low-molecular-weight liquid crystal compound but also a high-molecular-weight liquid crystal compound can be used.

The polymerizable liquid crystal compound can be obtained by introducing a polymerizable group into the liquid crystal compound. Examples of the polymerizable group include an unsaturated polymerizable group, an epoxy group, and an aziridinyl group. Among these, an unsaturated polymerizable group is preferable, and an ethylenically unsaturated polymerizable group is more preferable. The polymerizable group can be introduced into the molecules of the liquid crystal compound using various methods. The number of polymerizable groups in the polymerizable liquid crystal compound is preferably 1 to 6 and more preferably 1 to 3. Examples of the polymerizable liquid crystal compound include compounds described in Makromol. Chem. (1989), Vol. 190, p. 2255, Advanced Materials (1993), Vol. 5, p. 107, U.S. Pat. Nos. 4,683,327A, 5,622,648A, US5,770,107A, WO95/022586A, WO95/024455A, WO97/000600A, WO98/023580A, WO98/052905A, JP1989-272551A (JP-H1-272551A), JP1994-016616A (JP-H6-016616A), JP1995-110469A (JP-H7-110469A), JP1999-080081A (JP-H11-080081A), and JP2001-328973A. Two or more polymerizable liquid crystal compounds may be used in combination. In a case where two or more polymerizable liquid crystal compounds are used in combination, the alignment temperature can be decreased.

Specific examples of the polymerizable liquid crystal compound include compounds represented by the following Formulae (1) to (14).

(1)
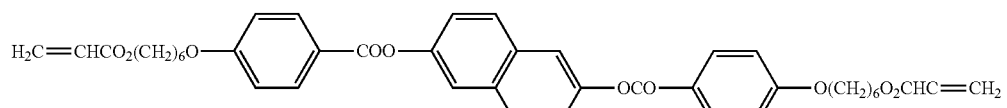
(2)
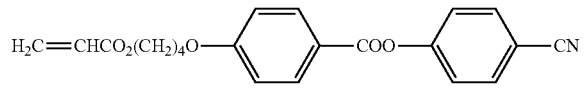
(3)
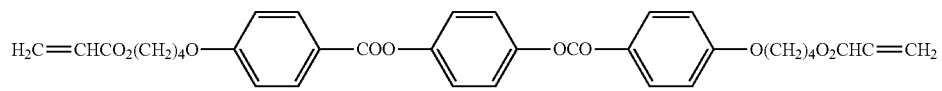
(4)
(5)
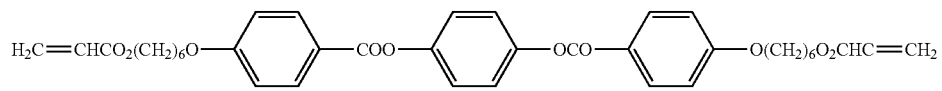
(6)
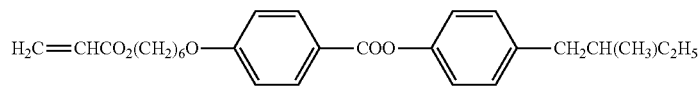
(7)
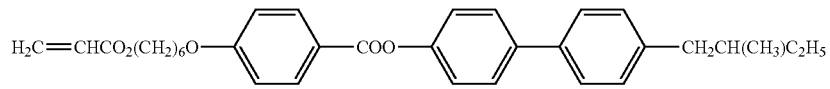
(8)
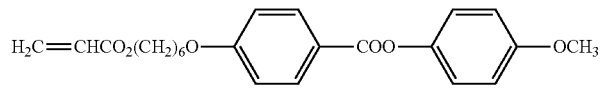
(9)
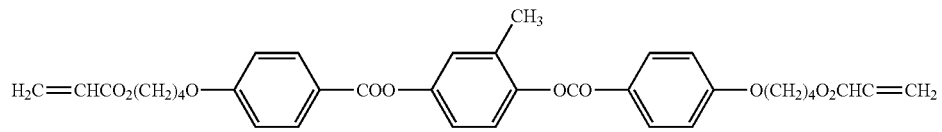
(10)
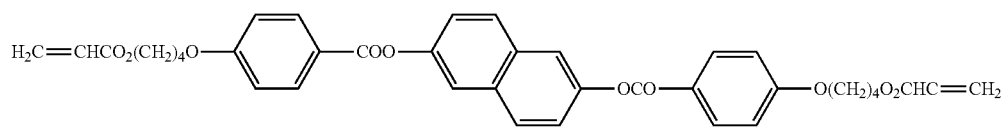
(11)
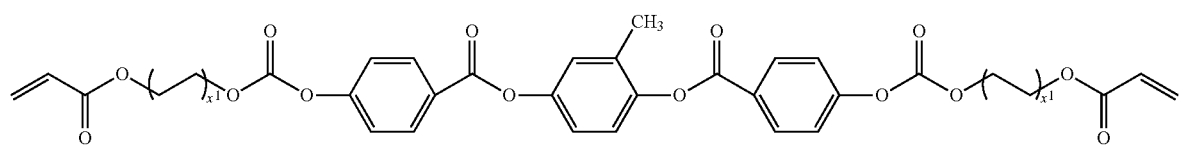
[In Compound (11), $X^1$ represents 2 to 5 (integer).]
(12)
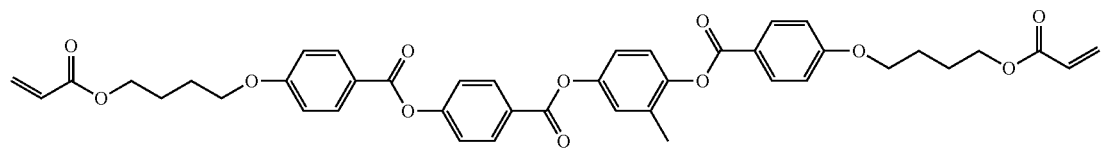

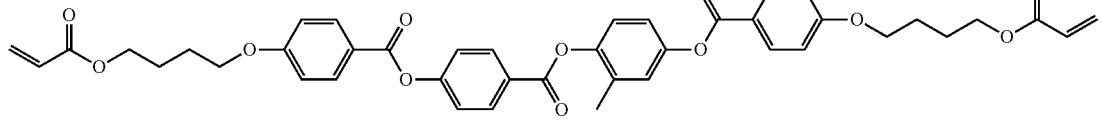

(13)

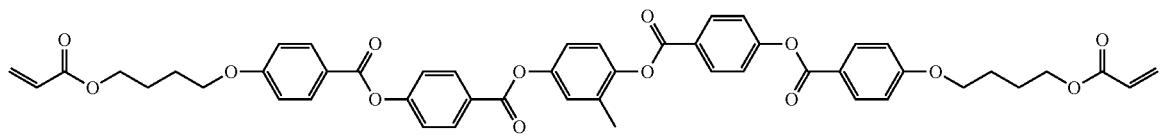

(14)

In addition, as described above, in order to obtain a wide bandwidth Δλ (the full width at half maximum Δλ of the selective reflection range where selective reflection is exhibited) and a high reflectivity, it is preferable that the refractive index anisotropy Δn of the cholesteric liquid crystalline phase is high. Accordingly, in order to obtain a wide bandwidth and a high reflectivity, it is preferable that a polymerizable liquid crystal compound having a high refractive index anisotropy Δn is used. Specifically, the refractive index anisotropy Δn at 30° C. of the polymerizable liquid crystal compound used in the liquid crystal composition is preferably 0.2 or higher as described above, more preferably 0.25 or higher, still more preferably 0.3 or higher, and even still more preferably 0.35 or higher. The upper limit of the refractive index anisotropy Δn of the polymerizable liquid crystal compound is not particularly limited and is likely to be 0.6 or lower.

As a method of measuring the refractive index anisotropy Δn, A method of using a wedge-shaped liquid crystal cell described in, for example, "Liquid Crystal Handbook" (the Editing Committee of Liquid Crystal Handbook, Maruzen Publishing Co., Ltd.), page 202 is generally used. In the case of a compound that is likely to be crystallized, the refractive index anisotropy Δn can be estimated from an extrapolation value in the evaluation of a mixture of the compound and another liquid crystals.

Examples of the polymerizable liquid crystal compound having a high refractive index anisotropy Δn include compounds described in U.S. Pat. No. 6,514,578B, JP3999400B, JP4117832B, JP4517416B, JP4836335B, JP5411770B, JP5411771B, JP5510321B, JP5705465B, JP5721484B, and JP5723641B.

Other preferable examples of the polymerizable liquid crystal compound include a polymerizable liquid crystal compound represented by the following Formula (1).

Formula (1)

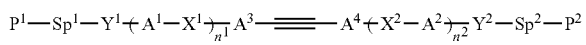

In Formula (1), $A^1$ to $A^4$ each independently represent an aromatic carbocyclic ring or a heterocycle which may have a substituent. Examples of the aromatic carbocyclic ring include a benzene ring and a naphthalene ring. Examples of the heterocycle include a furan ring, a thiophene ring, a pyrrole ring, a pyrroline ring, a pyrrolidine ring, an oxazole ring, an isoxazole ring, a thiazole ring, an isothiazole ring, an imidazole ring, an imidazoline ring, an imidazolidine ring, a pyrazole ring, a pyrazoline ring, a pyrazolidine ring, a triazole ring, a furazan ring, a tetrazole ring, a pyran ring, a thiin ring, a pyridine ring, a piperidine ring, an oxazine ring, a morpholine ring, a thiazine ring, a pyridazine ring, a pyrimidine ring, a pyrazine ring, a piperazine ring, and a triazine ring. In particular, $A^1$ to $A^4$ each independently represent preferably an aromatic carbocyclic ring and more preferably a benzene ring.

The kind of the substituent which may be substituted with the aromatic carbocyclic ring or the heterocycle is not particularly limited, and examples thereof include a halogen atom, a cyano group, a nitro group, an alkyl group, a halogen-substituted alkyl group, an alkoxy group, an alkylthio group, an acyloxy group, an alkoxycarbonyl group, a carbamoyl group, an alkyl-substituted carbamoyl group, and an acylamino group having 2 to 6 carbon atoms.

$X^1$ and $X^2$ each independently represent a single bond, —COO—, —OCO—, —CONH—, —NHCO—, —CH$_2$CH$_2$—, —OCH$_2$—, —CH$_2$O—, —CH=CH—, —CH=CH—COO—, —OCO—CH=CH—, or —C≡C—. Among these, a single bond, —COO—, —CONH—, —NHCO—, or —C≡C— is preferable.

$Y^1$ and $Y^2$ each independently represent a single bond, —O—, —S—, —CO—, —COO—, —OCO—, —CONH—, —NHCO—, —CH=CH—, —CH=CH—COO—, —OCO—CH=CH—, or —C≡C—. Among these, —O— is preferable.

$Sp^1$ and $Sp^2$ each independently represent a single bond or a carbon chain having 1 to 25 carbon atoms. The carbon chain may be linear, branched, or cyclic. As the carbon chain, a so-called alkyl group is preferable. Among these, an alkyl group having 1 to 10 carbon atoms is more preferable.

$P^1$ and $P^2$ each independently represent a hydrogen atom or a polymerizable group, and at least one of $P^1$ or $P^2$ represents a polymerizable group. Examples of the polymerizable group include the examples of the polymerizable group which is included in the liquid crystal compound having a polymerizable group.

$n^1$ and $n^2$ each independently represent an integer of 0 to 2. In a case where $n^1$ or $n^2$ represents 2, a plurality of $A^1$'s, $A^2$'s, $X^1$'s, or $X^2$'s may be the same as or different from each other.

Specific examples of the polymerizable liquid crystal compound represented by Formula (1) include compounds represented by the following Formulae (1-1) to (1-30).

(1-1)
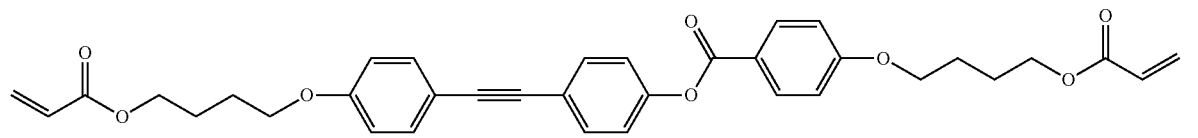
(1-2)
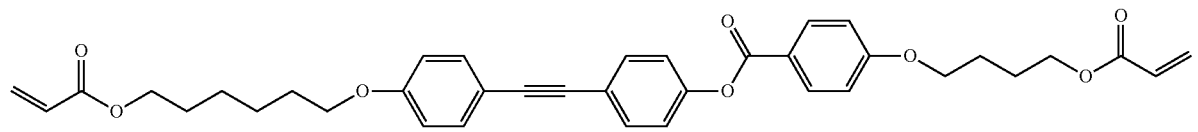
(1-3)
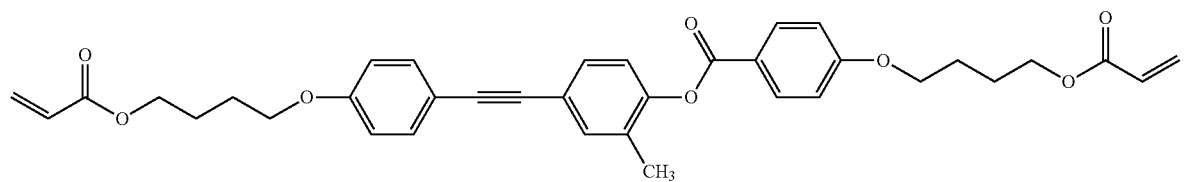
(1-4)
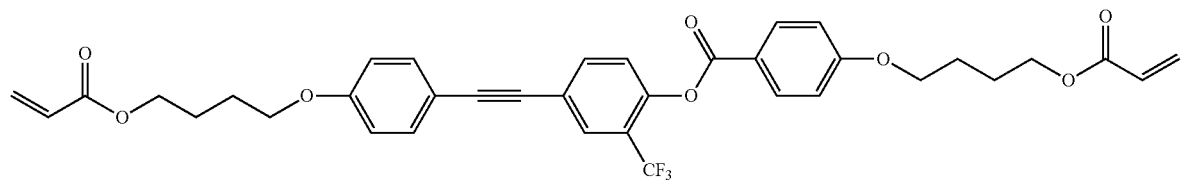
(1-5)
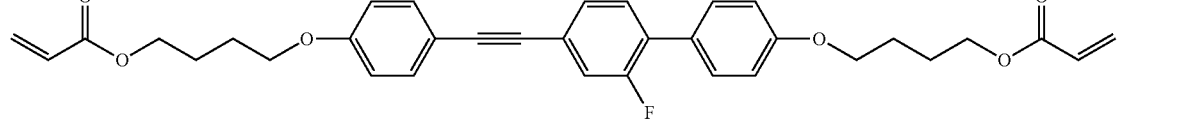
(1-6)
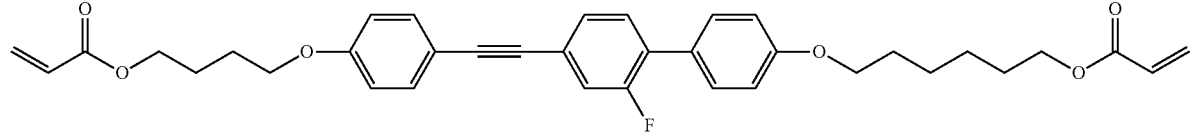
(1-7)
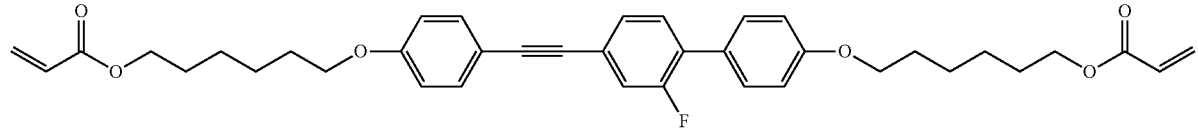
(1-8)
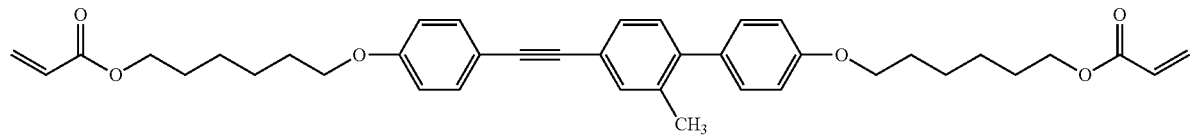
(1-9)
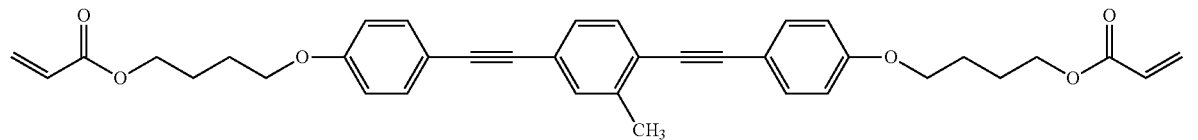

-continued
(1-10)
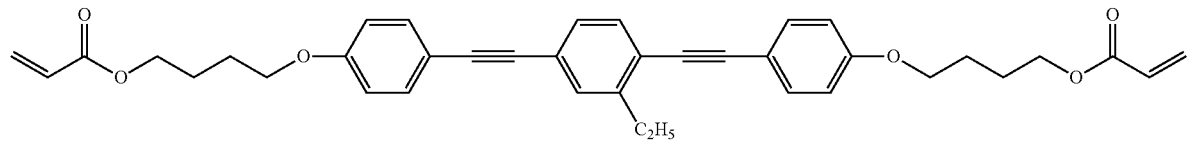
(1-11)
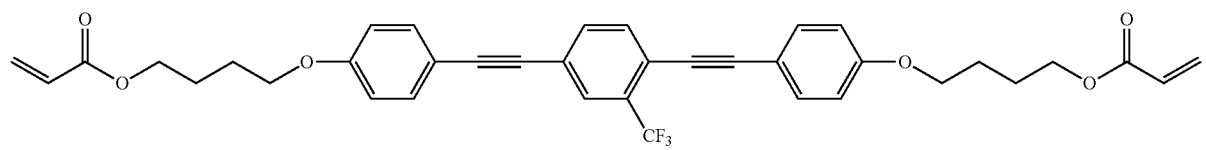
(1-12)
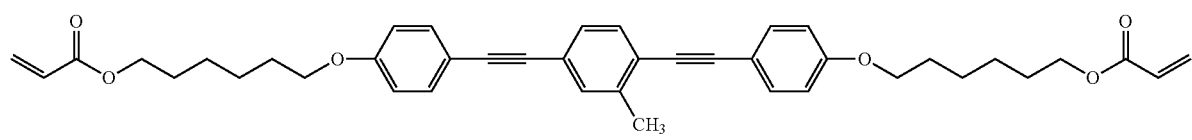
(1-13)
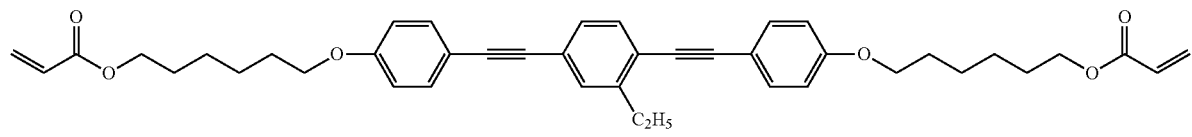
(1-14)
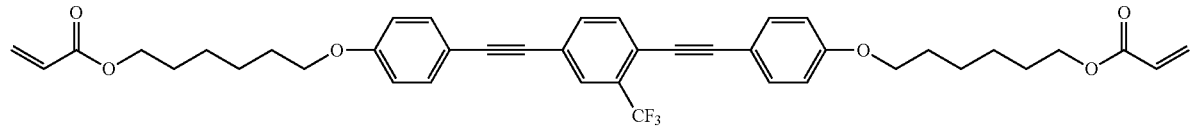
(1-15)
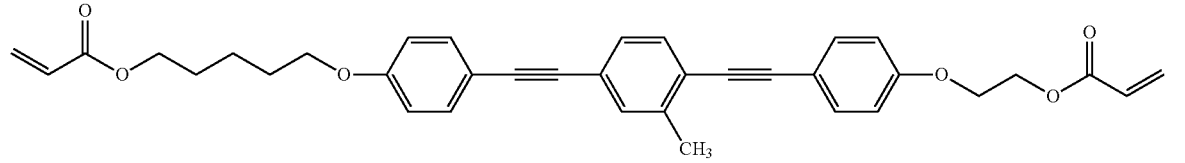
(1-16)
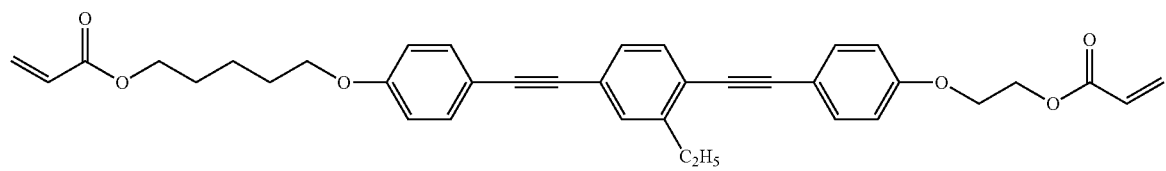
(1-17)
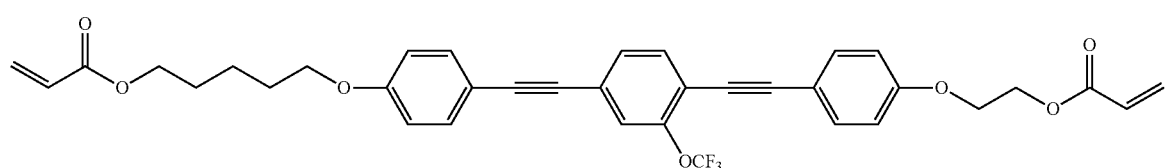
(1-18)
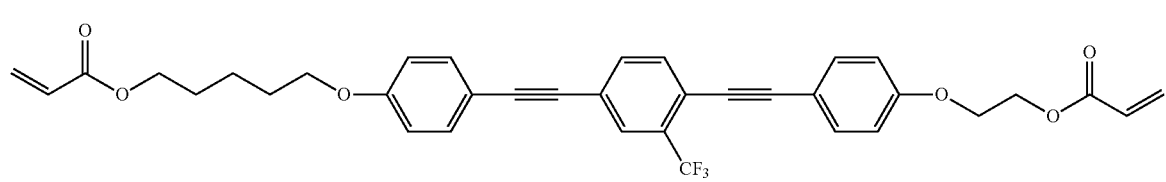

-continued
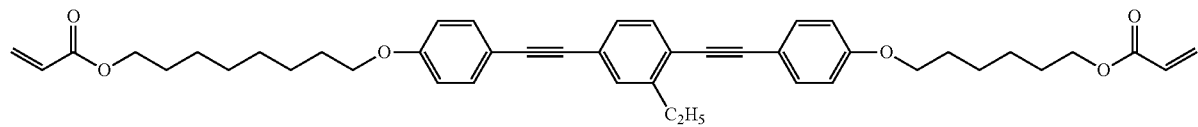
(1-19)
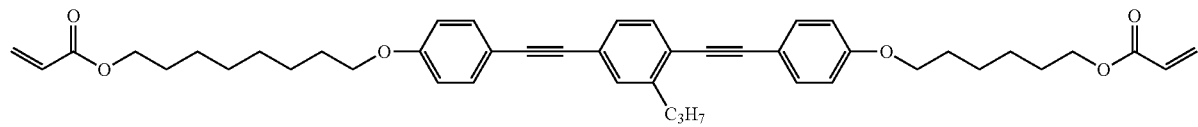
(1-20)
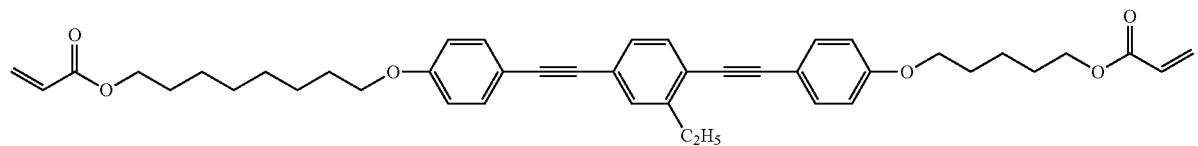
(1-21)
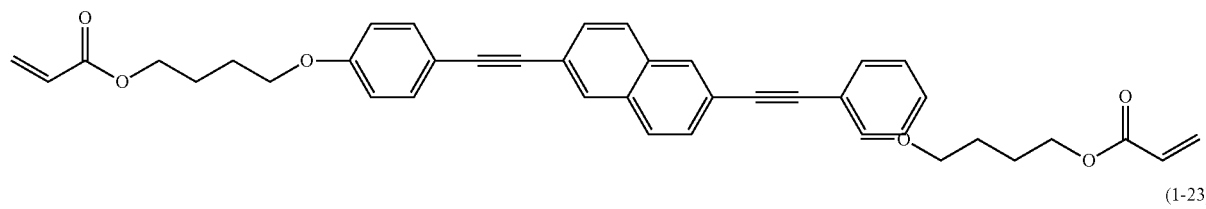
(1-22)
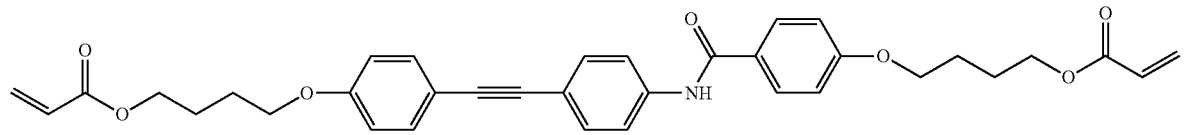
(1-23)
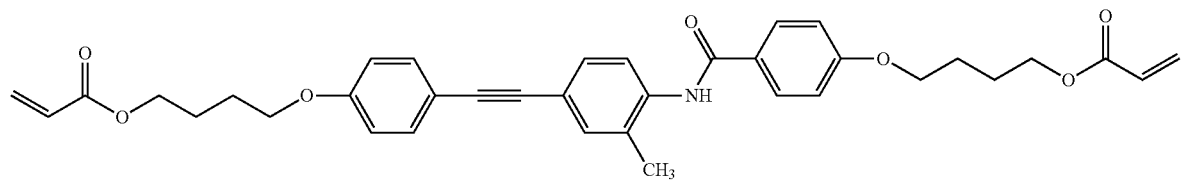
(1-24)
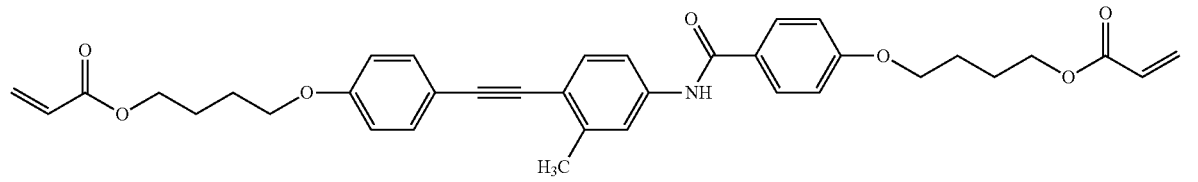
(1-25)
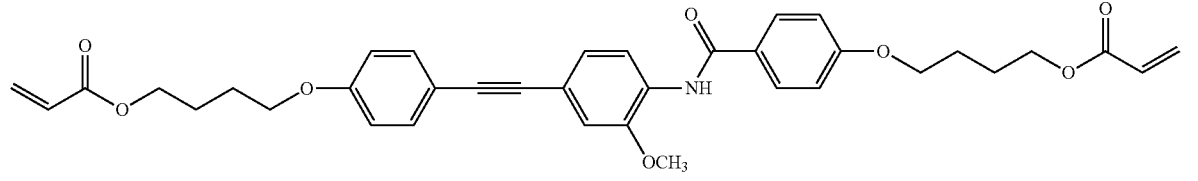
(1-26)

-continued (1-27)
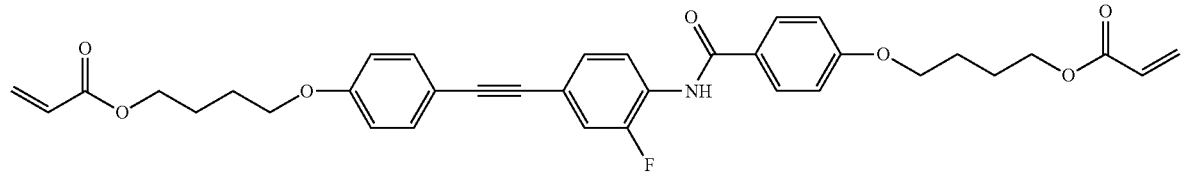

(1-28)
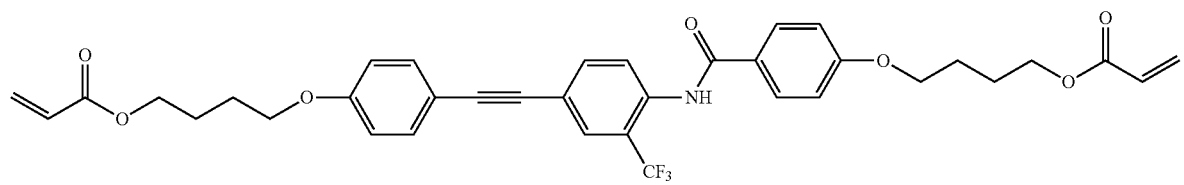

(1-29)
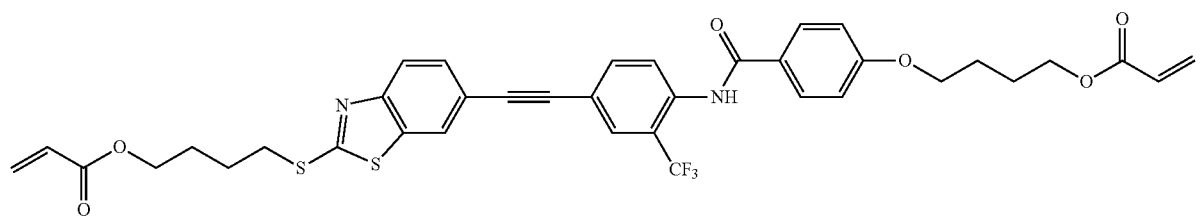

(1-30)
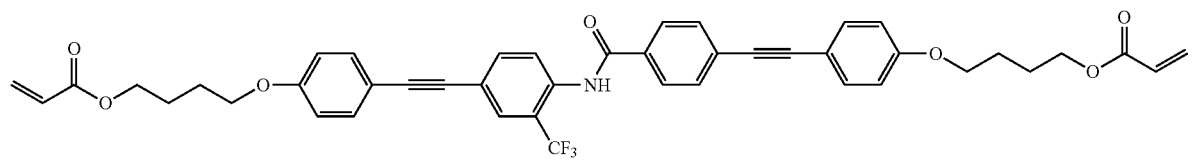

In addition, as a polymerizable liquid crystal compound other than the above-described examples, for example, a cyclic organopolysiloxane compound having a cholesteric phase described in JP1982-165480A (JP-S57-165480A) can be used. Further, as the above-described high-molecular-weight liquid crystal compound, for example, a polymer in which a liquid crystal mesogenic group is introduced into a main chain, a side chain, or both a main chain and a side chain, a polymer cholesteric liquid crystal in which a cholesteryl group is introduced into a side chain, a liquid crystal polymer described in JP1997-133810A (JP-H9-133810A), and a liquid crystal polymer described in JP1999-293252A (JP-H11-293252A) can be used.

In addition, the addition amount of the polymerizable liquid crystal compound in the liquid crystal composition is preferably 75 to 99.9 mass %, more preferably 80 to 99 mass %, and still more preferably 85 to 90 mass % with respect to the solid content mass (mass excluding a solvent) of the liquid crystal composition.

—Chiral Agent (Optically Active Compound)—The chiral agent has a function of causing a helical structure of a cholesteric liquid crystalline phase to be formed. The chiral agent may be selected depending on the purpose because a helical twisting direction or a helical pitch derived from the compound varies.

That is, in a case where the right circularly polarized light cholesteric layer 16r is formed, a chiral agent that induces right twisting may be used. In a case where the left circularly polarized light cholesteric layer 16l is formed, a chiral agent that induces left twisting may be used.

The chiral agent is not particularly limited, and a well-known compound (for example, Liquid Crystal Device Handbook (No. 142 Committee of Japan Society for the Promotion of Science, 1989), Chapter 3, Article 4-3, chiral agent for twisted nematic (TN) or super twisted nematic (STN), p. 199), isosorbide, or an isomannide derivative can be used.

In general, the chiral agent includes an asymmetric carbon atom. However, an axially asymmetric compound or a surface asymmetric compound not having an asymmetric carbon atom can also be used as a chiral agent. Examples of the axially asymmetric compound or the surface asymmetric compound include binaphthyl, helicene, paracyclophane, and derivatives thereof. The chiral agent may include a polymerizable group. In a case where both the chiral agent and the liquid crystal compound have a polymerizable group, a polymer which includes a repeating unit derived from the polymerizable liquid crystal compound and a repeating unit derived from the chiral agent can be formed due to a polymerization reaction of a polymerizable chiral agent and the polymerizable liquid crystal compound. In this aspect, it is preferable that the polymerizable group included in the polymerizable chiral agent is the same as the polymerizable group included in the polymerizable liquid crystal compound. Accordingly, the polymerizable group of the chiral agent is preferably an unsaturated polymerizable group, an epoxy group, or an aziridinyl group, more preferably an unsaturated polymerizable group, and still more preferably an ethylenically unsaturated polymerizable group.

In addition, the chiral agent may be a liquid crystal compound.

In a case where the chiral agent includes a photoisomerization group, a pattern having a desired reflection wavelength corresponding to an emission wavelength can be formed by photomask exposure of an actinic ray or the like after coating and alignment, which is preferable. As the photoisomerization group, an isomerization portion of a photochromic compound, an azo group, an azoxy group, or a cinnamoyl group is preferable. As a specific compound, compounds described in JP2000-147236A, JP2002-080478A, JP2002-080851A, JP2002-179633A, JP2002-179668A, JP2002-179669A, JP2002-179670A, JP2002-179681A, JP2002-179682A, JP2002-302487A, JP2002-338575A, JP2002-338668A, JP2003-306490A, JP2003-306491A, JP2003-313187A, JP2003-313188A, JP2003-313189A, and JP2003-313292A can be used.

The content of the chiral agent in the liquid crystal composition is preferably 0.01 to 200 mol % and more preferably 1 to 30 mol % with respect to the amount of the polymerizable liquid crystal compound.

—Polymerization Initiator—

In a case where the liquid crystal composition includes a polymerizable compound, it is preferable that the liquid crystal composition includes a polymerization initiator. In an aspect where a polymerization reaction progresses with ultraviolet irradiation, it is preferable that the polymerization initiator is a photopolymerization initiator which initiates a polymerization reaction with ultraviolet irradiation. Examples of the photopolymerization initiator include an α-carbonyl compound (described in U.S. Pat. Nos. 2,367,661A and 2,367,670A), an acyloin ether (described in U.S. Pat. No. 2,448,828A), an α-hydrocarbon-substituted aromatic acyloin compound (described in U.S. Pat. No. 2,722,512A), a polynuclear quinone compound (described in U.S. Pat. Nos. 3,046,127A and 2,951,758A), a combination of a triaryl imidazole dimer and p-aminophenyl ketone (described in U.S. Pat. No. 3,549,367A), an acridine compound and a phenazine compound (described in JP1985-105667A (JP-S60-105667A) and U.S. Pat. No. 4,239,850A), and an oxadiazole compound (described in U.S. Pat. No. 4,212,970A).

The content of the photopolymerization initiator in the liquid crystal composition is preferably 0.1 to 20 mass % and more preferably 0.5 to 12 mass % with respect to the content of the polymerizable liquid crystal compound.

—Crosslinking Agent—

In order to improve the film hardness after curing and to improve durability, the liquid crystal composition may include a crosslinking agent. As the crosslinking agent, a curing agent which can perform curing with ultraviolet light, heat, moisture, or the like can be preferably used.

The crosslinking agent is not particularly limited and can be appropriately selected depending on the purpose. Examples of the crosslinking agent include: a polyfunctional acrylate compound such as trimethylol propane tri(meth)acrylate or pentaerythritol tri(meth)acrylate; an epoxy compound such as glycidyl (meth)acrylate or ethylene glycol diglycidyl ether; an aziridine compound such as 2,2-bis hydroxymethyl butanol-tris[3-(1-aziridinyl)propionate] or 4,4-bis(ethyleneiminocarbonylamino)diphenylmethane; an isocyanate compound such as hexamethylene diisocyanate or a biuret type isocyanate; a polyoxazoline compound having an oxazoline group at a side chain thereof; and an alkoxysilane compound such as vinyl trimethoxysilane or N-(2-aminoethyl)-3-aminopropyltrimethoxysilane. In addition, depending on the reactivity of the crosslinking agent, a well-known catalyst can be used, and not only film hardness and durability but also productivity can be improved. Among these crosslinking agents, one kind may be used alone, or two or more kinds may be used in combination.

The content of the crosslinking agent is preferably 3 to 20 mass % and more preferably 5 to 15 mass % with respect to the solid content mass of the liquid crystal composition. In a case where the content of the crosslinking agent is in the above-described range, an effect of improving a crosslinking density can be easily obtained, and the stability of a cholesteric liquid crystalline phase is further improved.

—Polymerization Inhibitor—

In order to improve storage, the liquid crystal composition may include a polymerization inhibitor.

Examples of the polymerization inhibitor include hydroquinone, hydroquinone monomethyl ether, phenothiazine, benzoquinone, hindered amine (HALS), and derivatives thereof. Among these polymerization inhibitors, one kind may be used alone, or two or more kinds may be used in combination.

The content of the polymerization inhibitor is preferably 0 to 10 mass % and more preferably 0 to 5 mass % with respect to the solid content mass of the liquid crystal composition.

In a case where the cholesteric liquid crystal layer is formed, it is preferable that the liquid crystal composition is used as liquid.

The liquid crystal composition may include a solvent. The solvent is not particularly limited and can be appropriately selected depending on the purpose. An organic solvent is preferably used.

The organic solvent is not particularly limited and can be appropriately selected depending on the purpose. Examples of the organic solvent include a ketone such as methyl ethyl ketone, methyl isobutyl ketone, cyclohexanone, or cyclopentanone, an alkyl halide, an amide, a sulfoxide, a heterocyclic compound, a hydrocarbon, an ester, and an ether. Among these solvents, one kind may be used alone, or two or more kinds may be used in combination. Among these, a ketone is preferable in consideration of an environmental burden. The above-described component such as the above-described monofunctional polymerizable monomer may function as the solvent.

The right circularly polarized light cholesteric layer 16r may be formed using, for example, a method including: a step of applying a liquid crystal composition for forming the right circularly polarized light cholesteric layer 16r including a chiral agent that induces right twisting to the absorbing color filter 14; a step of heating the liquid crystal composition to form a cholesteric liquid crystalline phase having right circularly polarized light reflecting properties; and a step of irradiating (exposing) the cholesteric liquid crystalline phase with ultraviolet light to immobilize the cholesteric liquid crystalline phase.

On the other hand, the left circularly polarized light cholesteric layer 16l may be formed using, for example, a method including: a step of applying a liquid crystal composition for forming the left circularly polarized light cholesteric layer 16l including a chiral agent that induces left twisting to the right circularly polarized light cholesteric layer 16r that is formed first; a step of heating the liquid crystal composition to form a cholesteric liquid crystalline phase having right circularly polarized light reflecting properties; and a step of irradiating (exposing) the cholesteric liquid crystalline phase with ultraviolet light to immobilize the cholesteric liquid crystalline phase.

The application, drying, and ultraviolet irradiation of the liquid crystal composition may be performed using a well-known method.

Here, as described above, as the chiral agent, a chiral agent having a portion (photoisomerization group) such as a cinnamoyl group that is isomerized by light can be used. In a case where the chiral agent having a photoisomerization group is used as the chiral agent of the liquid crystal composition, the liquid crystal composition may be irradiated with weak patterned ultraviolet light once or more to isomerize the photoisomerization group after being applied and heated, and then may be irradiated with ultraviolet light to immobilize the cholesteric liquid crystalline phase.

Alternatively, the liquid crystal composition may be irradiated with strong patterned ultraviolet light for immobilizing the cholesteric liquid crystalline phase so as to be partially cured, a non-exposed portion or the entire surface may be irradiated with weak ultraviolet light to isomerize the photoisomerization group, and then the liquid crystal composition may be irradiated with ultraviolet light for immobilizing the cholesteric liquid crystalline phase.

As a result, in a plane of the right circularly polarized light cholesteric layer 16r and the left circularly polarized light cholesteric layer 16l, a plurality of reflecting regions that reflect light components having different wavelength ranges can be provided. In this case, in the right circularly polarized light cholesteric layer 16r and the left circularly polarized light cholesteric layer 16l, it is preferable that reflecting regions that reflect light components having the same wavelength range are laminated at the same position in a plane direction.

In addition, by adjusting a temperature during ultraviolet irradiation, the reflection wavelength range can also be adjusted. By irradiating the cholesteric liquid crystalline phase with patterned ultraviolet light while adjusting the temperature, in a plane of the right circularly polarized light cholesteric layer 16r and the left circularly polarized light cholesteric layer 16l, a plurality of reflecting regions that reflect light components having different wavelength ranges can be provided. In particular, by irradiating the cholesteric liquid crystalline phase with ultraviolet light in a state where the liquid crystal composition is heated to an isotropic phase temperature or higher, a transmission region having no reflection properties in any wavelength range can be formed in a plane.

Hereinafter, the action of the image sensor 10 will be described. In the following description, for example, the cholesteric reflecting layer 16 reflects (blocks) near infrared light in a wavelength range of longer than 780 nm and 1200 nm or shorter.

In a case where light is incident on the image sensor 10, first, left circularly polarized light of near infrared light in a wavelength range of longer than 780 nm and 1200 nm or shorter is reflected from the left circularly polarized light cholesteric layer 16l, and the other light components transmit through the left circularly polarized light cholesteric layer 16l and are reflected from the right circularly polarized light cholesteric layer 16r.

In a case where light is incident on the right circularly polarized light cholesteric layer 16r, right circularly polarized light of near infrared light in a wavelength range of longer than 780 nm and 1200 nm or shorter is reflected from the right circularly polarized light cholesteric layer 16r, and the other light components transmit through the right circularly polarized light cholesteric layer 16r. Accordingly, as a result, all the near infrared light in a wavelength range of longer than 780 nm and 1200 nm or shorter is blocked.

Light having transmitted through the right circularly polarized light cholesteric layer 16r is converted into red light, green light, or blue light by any one of the red filter 14R, the green filter 14G, or the blue filter 14B in the absorbing color filter 14, is measured by the solid image pickup element 12a, and is output as image data.

As described above, in the image sensor 10 according to the embodiment of the present invention, near infrared light in a wavelength range of longer than 780 nm and 1200 nm or shorter to which the solid image pickup element 12a has sensitivity is removed, and red light, green light, and blue light can be measured. Therefore, the amount of noise caused by infrared light is small, and appropriate image data can be output.

In addition, in the related art, an infrared filter that blocks (cuts) infrared light is separately provided distant from an image sensor. However, in the embodiment of the present invention, the infrared filter can be laminated on or incorporated into the image sensor 10 as the cholesteric reflecting layer 16. Therefore, the height (thickness) of an imaging device (imaging module) including the image sensor 10 can be significantly reduced.

Further, the cholesteric reflecting layer 16 as the infrared filter can be formed with a coating method using a liquid crystal composition. Therefore, the infrared filter having no particulate defects or the like that is difficult to be formed by vapor deposition of inorganic layers as in the case of a multi-layer film infrared reflecting layer can be formed, and deterioration of image quality caused by defects can also be prevented.

Figure 2:
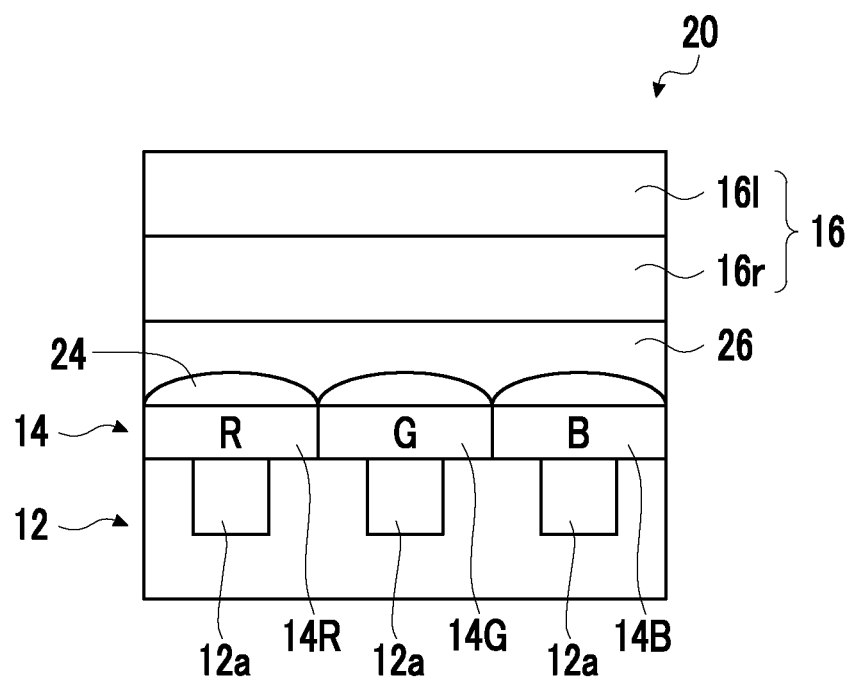
FIG. 2 is a diagram conceptually showing another example of the image sensor according to the embodiment of the present invention including another example of the color filter for an image sensor according to the embodiment of the present invention.

FIG. 2 conceptually shows another example of the image sensor according to the embodiment of the present invention including another example of the color filter according to the embodiment of the present invention.

An image sensor 20 shown in FIG. 2 includes the sensor main body 12, the absorbing color filter 14, the microlens 24, the planarizing layer 26, and the cholesteric reflecting layer 16. The cholesteric reflecting layer 16 includes the right circularly polarized light cholesteric layer 16r and the left circularly polarized light cholesteric layer 16l. In the example shown in FIG. 2, the color filter according to the embodiment of the present invention includes the absorbing color filter 14, the microlens 24, the planarizing layer 26, and the cholesteric reflecting layer 16.

The image sensor 20 shown in FIG. 2 has the same configuration as the image sensor 10 shown in FIG. 1, except that the microlens 24 and the planarizing layer 26 are provided between the absorbing color filter 14 and the cholesteric reflecting layer 16. Therefore, the same members are represented by the same reference numerals, and different members will be mainly described below.

In the image sensor 20 shown in FIG. 2, the microlens 24 is provided corresponding to each of the red filter 14R, the green filter 14G, and the blue filter 14B in the absorbing color filter 14, that is, corresponding to each of the solid image pickup elements 12a.

The microlens 24 is a convex lens in which the center is thicker than an edge, and collects light on the solid image pickup element 12a. All the microlenses 28 have the same shape.

The microlens 24 can be formed of various well-known materials as long as it satisfies optical characteristics that are necessary as a lens. For example, the microlens 24 is formed of a resin material, but the present invention is not limited thereto. Examples of the resin material used for the microlens 24 include a styrene resin, a (meth)acrylic resin, a styrene-acrylic copolymer resin, and a siloxane resin.

The planarizing layer 26 planarizes a cholesteric reflecting layer 16-side surface on the microlens 24 as a convex lens. The planarizing layer 26 may also function as a bonding layer (adhesive layer) for adhesion with an upper layer. In the example shown in the drawing, the upper layer above the planarizing layer 26 is the cholesteric reflecting layer 16, specifically, the right circularly polarized light cholesteric layer 16r.

The planarizing layer 26 is not particularly limited as long as it has sufficient light-transmitting property, and is formed of, for example, various resin materials. Examples of the resin material for forming the planarizing layer 26 include a fluorine-containing silane compound such as a fluorine-containing siloxane resin, a (meth)acrylic resin, a styrene resin, and an epoxy resin.

It is preferable that a refractive index of the microlens 24 is higher than that of the planarizing layer 26.

In addition, instead of providing the planarizing layer 26, support means for supporting the cholesteric reflecting layer 16 to be distant from the microlens 24 may be provided and an air layer may be provided between the microlens 24 and the cholesteric reflecting layer 16 such that this air layer functions as the planarizing layer 26 that planarizes the surface of the microlens 24.

In a case where any layer is provided between the absorbing color filter 14 and the cholesteric reflecting layer 16 as in the case of the image sensor 20 shown in FIG. 2, it is preferable that a gap between the absorbing color filter 14 and the cholesteric reflecting layer 16 is 100 µm or less. As the layer provided between the absorbing color filter 14 and the cholesteric reflecting layer 16, for example, the air layer is used.

As a result, the occurrence of ghosting in which light having transmitted through the respective color filters of the absorbing color filter 14 is incident on the solid image pickup element adjacent to the filter due to internal reflection or the like instead of being incident on the solid image pickup element 12a immediately below the filter can be suppressed.

The image sensor 20 shown in FIG. 2 can be prepared by providing a step of forming the microlens 24 on the absorbing color filter 14 (microlens forming step) and a step of forming the planarizing layer 26 that covers the microlens 24 (planarizing layer forming step) between the formation of the absorbing color filter 14 (filter forming step) and the formation of the cholesteric reflecting layer 16 (cholesteric reflecting layer forming step) in the manufacturing of the image sensor 10.

The microlens 24 may be formed using a well-known method corresponding to a material for forming the microlens 24. In addition, the planarizing layer 26 may also be formed using a well-known method corresponding to a material for forming the planarizing layer 26.

Figure 3:
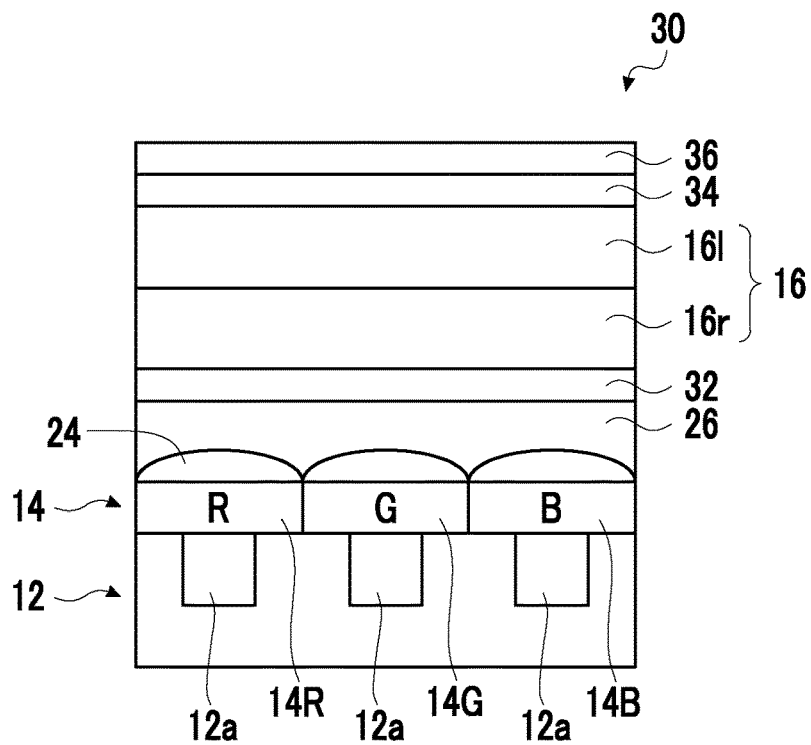
FIG. 3 is a diagram conceptually showing still another example of the image sensor according to the embodiment of the present invention including still another example of the color filter for an image sensor according to the embodiment of the present invention.

FIG. 3 conceptually shows still another example of the image sensor according to the embodiment of the present invention including still another example of the color filter according to the embodiment of the present invention.

An image sensor 30 shown in FIG. 3 includes the sensor main body 12, the absorbing color filter 14, the microlens 24, the planarizing layer 26, the aligned cholesteric layer 32, the cholesteric reflecting layer 16 (the right circularly polarized light cholesteric layer 16r and the left circularly polarized light cholesteric layer 16l), the infrared absorbing layer 34, and the antireflection layer 36. In the example shown in FIG. 3, the color filter according to the embodiment of the present invention includes the absorbing color filter 14, the microlens 24, the planarizing layer 26, the aligned cholesteric layer 32, the cholesteric reflecting layer 16, the infrared absorbing layer 34, and the antireflection layer 36.

The image sensor 30 shown in FIG. 3 has the same configuration as the image sensor 20 shown in FIG. 2, except that the aligned cholesteric layer 32, the infrared absorbing layer 34, and the antireflection layer 36 are provided. Therefore, the same members are represented by the same reference numerals, and different members will be mainly described below.

The aligned cholesteric layer 32 is a layer for maintaining the alignment of the cholesteric liquid crystalline phase in the right circularly polarized light cholesteric layer 16r and the left circularly polarized light cholesteric layer 16l.

For the aligned cholesteric layer 32, various well-known materials used as the aligned film of the cholesteric liquid crystal layer can be used.

It is preferable that the aligned cholesteric layer 32 is a photo-aligned film. For example, the photo-aligned film is irradiated with linearly polarized light or oblique non-polarized light at a wavelength at which a photochemical reaction occurs in a photochemical molecule such as an azobenzene polymer or polyvinyl cinnamate such that anisotropy is imparted to the surface of the photo-aligned film. As a result, a molecular major axis of the outermost surface of the film is aligned by incidence light, and an alignment restriction force that aligns liquid crystals in contact with the molecule of the outermost surface is generated.

Examples of the material of the photo-aligned film include not only the above-described materials but also any materials that impart anisotropy to a film surface due to any reaction among photoisomerization, photodimerization, photocyclization, photocrosslinking, photodegradation, and photodegradation-bonding by irradiation of linearly polarized light at a wavelength at which a photochemical reaction occurs in a photochemical molecule. For example, various photo-aligned film materials described in "Masaki Hasegawa, Journal of the Liquid Crystal Society of Japan, Vol. 3 No. 1, p. 3 (1999)" or "Yasumasa Takeuchi, Journal of the Liquid Crystal Society of Japan, Vol. 3 No. 4, p. 262 (1999)" can be used.

The aligned cholesteric layer 32 may be included in the image sensor 10 shown in FIG. 1 that is described above and an image sensor 40 shown in FIG. 4 and an image sensor 50 shown in FIG. 5 that are described below.

The infrared absorbing layer 34 is an absorbing infrared filter that absorbs and blocks infrared light in a predetermined wavelength range.

For example, the infrared absorbing layer 34 absorbs and blocks infrared light in a wavelength range different from infrared light that is blocked by the cholesteric reflecting layer 16. For example, the infrared absorbing layer 34 as a near infrared absorbing layer absorbs and blocks light in a near infrared range (infrared light on a short wavelength side) of longer than 780 nm and 820 nm or shorter, and the cholesteric reflecting layer 16 blocks infrared light on a longer wavelength side.

For example, the infrared absorbing layer 34 includes an infrared absorbing material having an infrared absorbing function. For example, the infrared absorbing layer 34 is formed of a mixture of an infrared absorbing colorant and a binder resin.

As the infrared absorbing colorant, various well-known materials can be used according to an absorption wavelength range.

Specifically, examples of the infrared absorbing colorant include colorants having, as a main skeleton, a dithiol complex, an aminothiol complex, phthalocyanine, naphthalocyanine, a copper phosphate complex, a nitroso compound, or a metal complex thereof. Examples of the metal portion in the complex include iron, magnesium, nickel, cobalt, steel, vanadium, zinc, palladium, platinum, titanium, indium, and tin. In addition, examples of an element in the ligand portion include organic ligands having a portion such as halogens, an amine group, a nitro group, or a thiol group. Further, a substituent such as an alkyl group, a hydroxyl group, a carboxyl group, an amino group, a nitro group, a cyano group, a fluorinated alkyl group, or an ether group may be introduced.

In addition, preferable examples of the infrared absorbing colorant include a methine dye such as cyanine or merocyanine and an organic compound such as triarylmethane, squarylium, anthraquinone, naphthoquinone, quaterrylene, perylene, rutile, immonium, diimmonium, croconium, oxanol, diketo pyrrolo pyrrole, or an aluminum salt. Further, other examples of the infrared absorbing colorant include a metal oxide such as indium tin oxide (ITO), aluminum doped zinc oxide (AZO), tungsten oxide, antimony oxide, or cesium tungsten oxide.

The antireflection layer 36 reduces a difference in refractive index between the infrared absorbing layer 34 and air to prevent light incident on the image sensor 30 from being reflected from an interface between the infrared absorbing layer 34 and air or to prevent light incident from the lower layer side to the infrared absorbing layer 34 from being reflected from an interface between the infrared absorbing layer 34 and air such that noise generated by the light being incident on the solid image pickup element 12a is prevented.

A material for forming the antireflection layer 36 is not particularly limited and may be an organic material or an inorganic material. From the viewpoint of durability, an inorganic material is preferable. Examples of the inorganic material include an inorganic resin (siloxane resin) and inorganic particles. Among these, it is preferable that the antireflection layer 36 includes inorganic particles. In addition, as the antireflection layer 36, various well-known antireflection layers that can reduce a difference in refractive index between the infrared absorbing layer 34 and air and are used in an optical element or an optical device can be used as long as they have sufficient transparency, and examples thereof include a dielectric film formed of any one of aluminum oxide, magnesium fluoride, zirconium oxide, or silicon oxide, and a dielectric multi-layer film in which a plurality of dielectric films are laminated.

The image sensor 30 shown in FIG. 3 can be prepared using a method including: forming the aligned cholesteric layer 32 on the surface of the absorbing color filter 14, that is, the surface where the cholesteric reflecting layer 16 is formed after the formation of the absorbing color filter 14 in the manufacturing of the image sensor 20 (aligned layer forming step); forming the cholesteric reflecting layer 16; forming the infrared absorbing layer 34 (near infrared absorbing layer) (infrared absorbing layer forming step); and forming the antireflection layer 36 (antireflection layer forming step).

The formation of the aligned cholesteric layer 32, the infrared absorbing layer 34, and the antireflection layer 36 may be performed using a well-known method according to a material for forming the layer.

Here, as described above, it is preferable that the aligned cholesteric layer 32 is a photo-aligned film. In this case, it is preferable that the formation of the aligned cholesteric layer 32 (aligned layer forming step) includes a step of forming a photo-aligned film and a step of irradiating the formed photo-aligned film with polarized light to impart an alignment restriction force.

Further, the formation of the infrared absorbing layer 34 (infrared absorbing layer forming step) may be performed before the step of forming the right circularly polarized light cholesteric layer 16r or before the step of forming the left circularly polarized light cholesteric layer 16l. That is, the formation of the infrared absorbing layer 34 may be performed at any timing as long as it is performed after the formation of the absorbing color filter 14 (filter forming step) or after the formation of the planarizing layer 26 (planarizing layer forming step).

In addition, in a case where the infrared absorbing layer 34 is formed before the formation of the cholesteric reflecting layer 16 and the aligned cholesteric layer 32 is formed, the formation of the aligned cholesteric layer 32 is performed between the formation of the infrared absorbing layer 34 and the formation of the right circularly polarized light cholesteric layer 16r or between the formation of the infrared absorbing layer 34 and the formation of the left circularly polarized light cholesteric layer 16l.

In the image sensor according to the embodiment of the present invention, that is, the color filter for an image sensor according to the embodiment of the present invention, an ultraviolet absorbing layer or an oxygen barrier layer may be further provided as an upper layer above the cholesteric reflecting layer 16 in FIGS. 1 to 3, that is, on an upper side above the cholesteric reflecting layer 16.

As a result, deterioration of the cholesteric reflecting layer 16 can be suppressed, and stability of the image sensor can also be improved.

The ultraviolet absorbing layer is a layer including an ultraviolet absorber. Accordingly, the ultraviolet absorbing layer may be one separate layer not having other functions or may be a layer that is obtained by adding an ultraviolet absorber to a layer having any function to exhibit a function as an ultraviolet absorbing layer.

In a case where the image sensor according to the embodiment of the present invention includes the ultraviolet absorbing layer, various configurations may be adopted. It is preferable that the ultraviolet absorbing layer is provided at a position where light is incident first before being incident on the cholesteric reflecting layer 16 or the infrared absorbing layer 34. That is, in a case where an ultraviolet absorber is added to a layer having any function to exhibit a function as an ultraviolet absorbing layer, it is preferable that the ultraviolet absorber is added to a layer (in the member) where light is incident first before being incident on the cholesteric reflecting layer 16 or the infrared absorbing layer 34.

For example, it is preferable that the ultraviolet absorber is added to any layer that is disposed between a glass plate disposed on the outdoor side and the cholesteric reflecting layer 16 and the infrared absorbing layer 34. Alternatively, it is preferable that the ultraviolet absorbing layer is provided between a glass plate disposed on the outdoor side and the cholesteric reflecting layer 16 and the infrared absorbing layer 34. Alternatively, it is also preferable that the ultraviolet absorber is added to an intermediate film that adheres to a glass plate disposed on the outdoor side or added to the glass plate itself disposed on the outdoor side.

The kind of the ultraviolet absorber is not particularly limited and can be appropriately selected depending on the purpose.

Examples of the ultraviolet absorber include a benzotriazole compound, a benzodithiol compound, a coumarin compound, a benzophenone compound, a salicylic acid ester compound, and a cyanoacrylate compound. In addition, for example, titanium oxide and/or zinc oxide can also be used as the ultraviolet absorber. Other examples of the ultraviolet absorber include a commercially available product such as Tinuvin 326, 328, and 479 (all of which are manufactured by Chiba Japan).

In addition, as the ultraviolet absorber, for example, an aminodiene compound, a salicylate compound, a benzophenone compound, a benzotriazole compound, an acrylonitrileacrylonitrile compound, or a triazine compound can also be preferably used. Specific examples of the ultraviolet absorber include compounds described in JP2013-068814A. In addition, as the benzotriazole compound, MYUA series (manufactured by Miyoshi Oil&Fat Co., Ltd.; The Chemical Daily, Feb. 1, 2016) may be used.

In the ultraviolet absorbing layer (layer including the ultraviolet absorber), the addition amount of the ultraviolet absorber is not particularly limited and may be appropriately set according to the purpose and the ultraviolet absorber to be used.

Here, in a case where the ultraviolet absorbing layer has an action of adjusting the transmittance of ultraviolet light having a wavelength of 380 nm or shorter to be 0.1% or lower, deterioration of the cholesteric reflecting layer 16 can be significantly reduced, and yellowing of the image sensor (the color filter for an image sensor) can be significantly reduced. Accordingly, it is preferable that the addition amount of the ultraviolet absorber in the ultraviolet absorbing layer is adjusted such that the above-described transmittance of ultraviolet light can be achieved.

In addition, as described above, the image sensor according to the embodiment of the present invention may include an oxygen barrier layer.

The oxygen barrier layer is used in order to prevent penetration of oxygen into a lower layer such that deterioration caused by oxygen is prevented. Accordingly, the oxygen barrier layer is particularly effective in a case where a material used for the cholesteric reflecting layer 16 and/or the infrared absorbing layer 34 may cause oxidation degradation.

As the oxygen barrier layer, an organic deposited film or an inorganic deposited film may be used. From the viewpoint of durability, an inorganic deposited film is preferable. In a case where the inorganic deposited film is used as the antireflection layer 36, the antireflection layer 36 can also function as the oxygen barrier layer.

In addition, it is also preferable that a sheet-like material such as glass having a high oxygen barrier function is laminated on an upper layer as the oxygen barrier layer. At this time, as shown in the second aspect of the method of manufacturing a color filter for an image sensor described below, it is preferable to use a manufacturing method in which the cholesteric reflecting layer 16 that is formed in advance on another substrate (the substrate 42 such as glass) is bonded to the sensor including the absorbing color filter.

Figure 4:
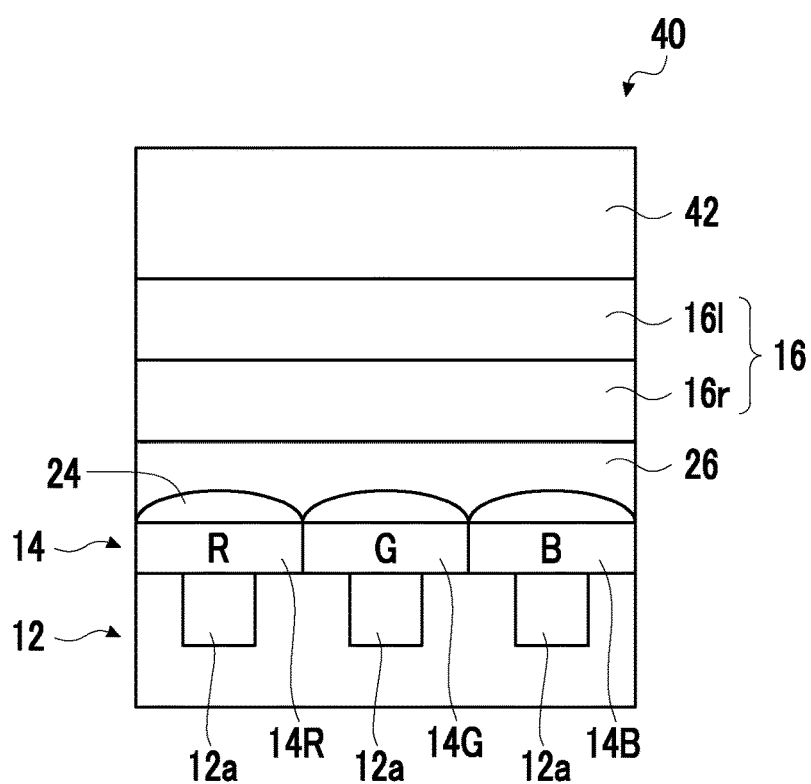
FIG. 4 is a diagram conceptually showing still another example of the image sensor according to the embodiment of the present invention including still another example of the color filter for an image sensor according to the embodiment of the present invention.

FIG. 4 conceptually shows still another example of the image sensor according to the embodiment of the present invention including still another example of the color filter according to the embodiment of the present invention.

The image sensor 40 shown in FIG. 4 includes the sensor main body 12, the absorbing color filter 14, the microlens 24, the planarizing layer 26, the cholesteric reflecting layer 16, and the substrate 42. In the example shown in FIG. 4, the color filter according to the embodiment of the present invention includes the absorbing color filter 14, the microlens 24, the planarizing layer 26, the cholesteric reflecting layer 16, and the substrate 42.

The image sensor 40 shown in FIG. 4 has the same configuration as the image sensor 20 shown in FIG. 2, except that the substrate 42 is provided. Therefore, the same members are represented by the same reference numerals, and different members will be mainly described below.

In addition, the configuration in which the substrate 42 is provided is applicable to the image sensor 10 shown in FIG. 1.

The substrate 42 is, for example, a sheet-like material formed of a resin material.

Examples of a material for forming the substrate 42 include glass, triacetyl cellulose (TAC), polyethylene terephthalate (PET), polycarbonate, polyvinyl chloride, acryl, polyolefin, and polycycloolefin.

The image sensor 40 including the substrate 42 may be prepared, for example, as follows.

First, as described above, the absorbing color filter 14 is formed on the sensor main body 12 (filter forming step), the microlens 24 is formed on the absorbing color filter 14 (microlens forming step), and the planarizing layer 26 that planarizes the surface of the microlens 24 is formed on the microlens 24.

At this time, it is preferable that the planarizing layer 26 is formed using a pressure sensitive adhesive or an adhesive such that the planarizing layer 26 functions as a bonding layer for adhesion with the substrate 42 described below. In this case, the formation of the planarizing layer 26 corresponds to the bonding layer forming step in the embodiment of the present invention.

In a case where the substrate 42 is used in the image sensor 10 shown in FIG. 1, the formation of the microlens 24 and the formation of the planarizing layer 26 are not performed.

On the other hand, the cholesteric reflecting layer 16 is formed on the surface of the substrate 42 by performing the step of forming the left circularly polarized light cholesteric layer 16l and the step of forming the right circularly polarized light cholesteric layer 16r as described above (cholesteric reflecting layer forming step).

As in the case of the above-described example, the order of formation of the left circularly polarized light cholesteric layer 16l and the right circularly polarized light cholesteric layer 16r may be reversed.

Next, the sensor main body 12 and the substrate 42 are aligned, laminated, and bonded such that the planarizing layer 26 (bonding layer) and the right circularly polarized light cholesteric layer 16r face each other (bonding step). As a result, the image sensor 40 shown in FIG. 4 is prepared.

It is preferable that the bonding is performed such that a gap between the absorbing color filter 14 and the cholesteric reflecting layer 16 is 100 μm or less. As a result, the occurrence of ghosting in which light having transmitted through the respective color filters of the absorbing color filter 14 is incident on the solid image pickup element adjacent to the filter due to internal reflection or the like instead of being incident on the solid image pickup element 12a immediately below the filter can be suppressed.

Further, the image sensor 20 shown in FIG. 2 may be prepared by removing the substrate 42 from the image sensor 40 shown in FIG. 4 (removing step). In this case, the image sensor 40 shown in FIG. 4 is an intermediate of the image sensor 20 shown in FIG. 2.

Figure 5:
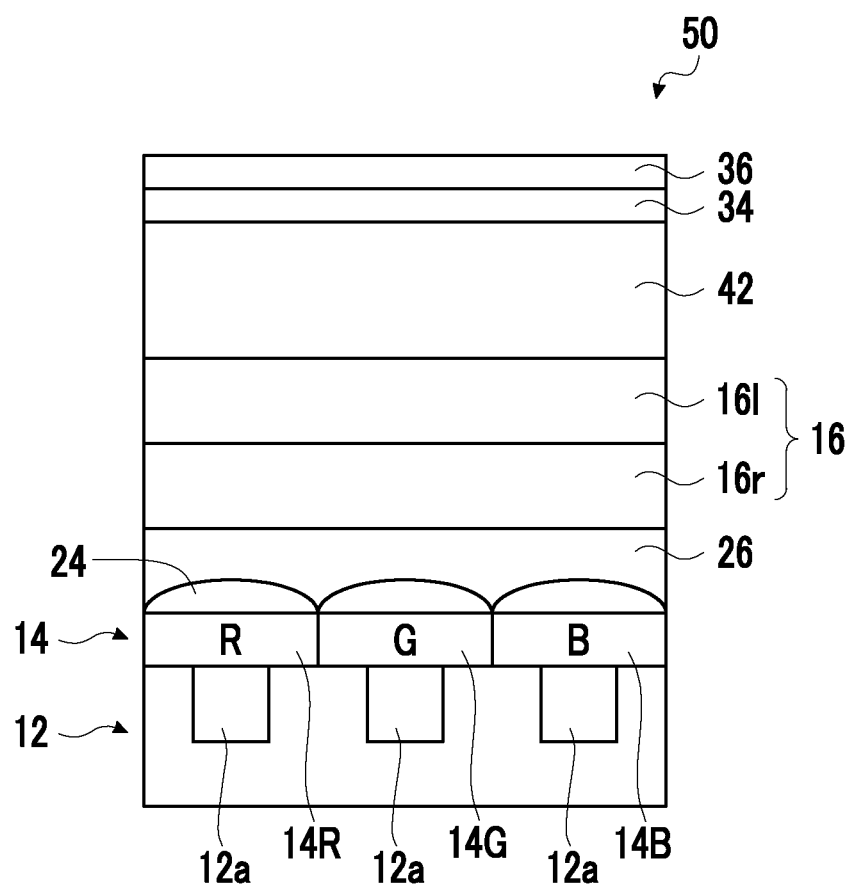
FIG. 5 is a diagram conceptually showing still another example of the image sensor according to the embodiment of the present invention including still another example of the color filter for an image sensor according to the embodiment of the present invention.

In addition, in the embodiment of the present invention, the configuration of the image sensor 50 shown in FIG. 5 that is prepared by forming the infrared absorbing layer 34 and the antireflection layer 36 shown in FIG. 3 on the substrate 42 of the image sensor 40 shown in FIG. 4 can also be used.

In the example shown in FIGS. 4 and 5, only one of the infrared absorbing layer 34 and the antireflection layer 36 may be provided.

Hereinabove, the color filter, the image sensor, and the method of manufacturing a color filter according to the embodiment of the present invention have been described in detail. However, the present invention is not limited to the above-described examples, and various improvements and modifications can be made within a range not departing from the scope of the present invention.

The color filter and the image sensor according to the embodiment of the present invention can be suitably used in an imaging device such as a digital camera or a smartphone.

EXAMPLES

Hereinafter, the present invention will be described in more detail using specific examples according to the present invention.

[Preparation of Cholesteric Reflecting Layer]

In order to verify whether or not desired spectral characteristics can be realized in the color filter for an image sensor according to the embodiment of the present invention, a cholesteric reflecting layer was prepared on a glass substrate to evaluate spectral characteristics. In order to measure an optical spectrum, a spectrophotometer UV-3100PC (manufactured by Shimadzu Corporation) was used.

<Preparation of Coating solution (R1)>

A compound (9), a compound (11), a dextrorotatory chiral agent 1, a fluorine horizontal alignment agent 1, a polymerization initiator, and a solvent were mixed with each other to prepare a coating solution (R1) having the following composition. The compound (9) and the compound (11) correspond to the compound (9) and the compound (11) described above as the examples of the polymerizable liquid crystal compound, and $X^1$ in the compounds (11) represents 2.

<<Coating Solution (R1)>>

Compound (9): 80 parts by mass
Compound (11): 20 parts by mass
Dextrorotatory chiral agent 1: 3.76 parts by mass
Fluorine horizontal alignment agent 1: 0.1 part by mass
Polymerization initiator (IRGACURE 819, manufactured by BASF SE): 4 parts by mass
Solvent (chloroform): an amount in which the solute concentration was 25 mass %

The dextrorotatory chiral agent 1 and the fluorine horizontal alignment agent 1 are the following compounds.

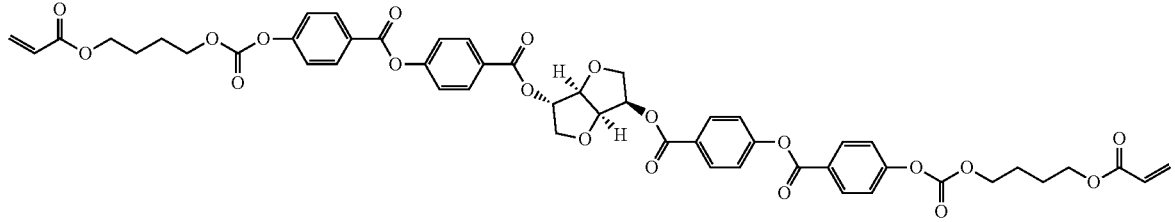

Dextrorotatory Chiral Agent 1

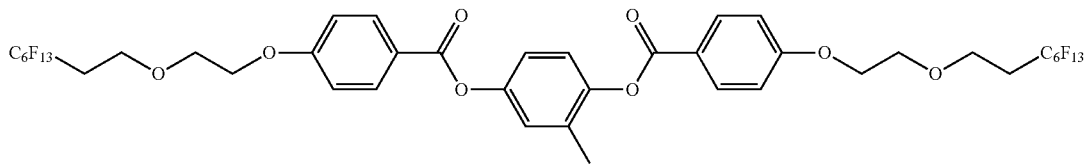

Fluorine Horizontal Alignment Agent 1

<Preparation of Coating Solution (R2) to Coating Solution (R6)>

Coating solutions (R2) to (R6) were prepared to have the same composition as that of the coating solution (R1) except that the addition amount of the dextrorotatory chiral agent 1 in the preparation of the coating solution (R1) was changed as shown in the following table.

<Preparation of Coating Solution (L1) to Coating Solution (L8)>

Coating solutions (L1) to (L8) were prepared to have the same composition as that of the coating solution (R1) except that the following levorotatory chiral agent 1 was used instead of the dextrorotatory chiral agent 1 in the preparation of the coating solution (R1) and the addition amount of the levorotatory chiral agent 1 was changed as shown in the following table.

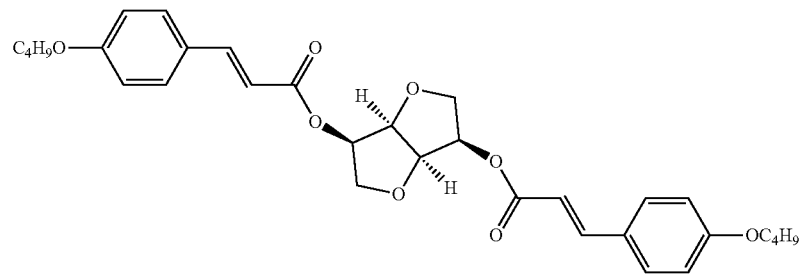

Levorotatory Chiral Agent 1

<Preparation of Glass Substrate (P1) With Photo-Aligned Film>

A photo-aligned film-forming coating solution 1 was prepared with reference to the description of Example 3 of JP2012-155308A.

The prepared photo-aligned film-forming coating solution 1 was applied to the glass substrate using a spin coating method. As a result, a photo-aligned film-forming film 1 was formed. The obtained photo-aligned film-forming film 1 was irradiated with polarized ultraviolet light (300 mJ/cm$^2$, 750 W extra high pressure mercury lamp was used) through a wire grid polarizer. As a result, a glass substrate (P1) with the photo-aligned film was formed.

<Preparation of Right Circularly Polarized Light Cholesteric Layer (RF1)>

The coating solution (R1) was applied to the glass substrate (P1) with the photo-aligned film using a spin coating method, was dried, and was immobilized. As a result, a coating film having a thickness of 5 µm was formed.

The glass substrate (P1) with the photo-aligned film on which the coating film of the coating solution (R1) was formed was heated on a hot plate at 80° C. for 1 minute such that the solvent was dried and removed and a cholesteric aligned state was formed. Next, using EXECURE 3000-W (manufactured by HOYA-SCHOTT), the glass substrate (P1) with the photo-aligned film was irradiated with ultraviolet (UV) light for 10 seconds at an illuminance of 30 mW/cm$^2$ at room temperature in a nitrogen atmosphere such that the alignment was immobilized. As a result, a right circularly polarized light cholesteric layer (RF1) was prepared.

A reflection center wavelength of the right circularly polarized light cholesteric layer (RF1) was 728 nm in case of being measured using a spectrophotometer (spectrophotometer UV-3100PC, manufactured by Shimadzu Corporation). In other words, the reflection center wavelength is a center wavelength of selective reflection.

<Preparation of Right Circularly Polarized Light Cholesteric Layer (RF2) to Right Circularly Polarized Light Cholesteric Layer (RF6)>

Right circularly polarized light cholesteric layer (RF2) to right circularly polarized light cholesteric layer (RF6) were prepared under the same conditions as those of the right circularly polarized light cholesteric layer (RF1), except that the coating solution (R2) to the coating solution (R6) were used instead of the coating solution (R1) in the step of preparing the right circularly polarized light cholesteric layer (RF1).

In addition, the reflection center wavelength of each of the right circularly polarized light cholesteric layers was measured under the same conditions as those of the right circularly polarized light cholesteric layer (RF1). The reflection center wavelength of each of the right circularly polarized light cholesteric layers was as shown in the following table.

<Preparation of Left Circularly Polarized Light Cholesteric Layer (LF1) to Left Circularly Polarized Light Cholesteric Layer (LF8)>

Left circularly polarized light cholesteric layer (LF1) to left circularly polarized light cholesteric layer (LF8) were prepared under the same conditions as those of the right circularly polarized light cholesteric layer (RF1), except that the coating solution (L1) to the coating solution (L8) were used instead of the coating solution (R1) in the step of preparing the right circularly polarized light cholesteric layer (RF1).

In addition, the reflection center wavelength of each of the left circularly polarized light cholesteric layers was measured under the same conditions as those of the right circularly polarized light cholesteric layer (RF1). The reflection center wavelength of each of the left circularly polarized light cholesteric layers was as shown in the following table.

TABLE 1

| Coating Solution | Chiral Agent | Addition Amount | Reflection Center Wavelength |
|---|---|---|---|
| R1 | Dextrorotatory | 3.76 parts by mass | 728 nm |
| R2 | Chiral Agent 1 | 3.47 parts by mass | 786 nm |
| R3 |  | 3.19 parts by mass | 841 nm |
| R4 |  | 2.95 parts by mass | 918 nm |
| R5 |  | 2.74 parts by mass | 1013 nm |
| R6 |  | 2.54 parts by mass | 1049 nm |
| L1 | Levorotatory | 6.27 parts by mass | 723 nm |
| L2 | Chiral Agent 1 | 5.72 parts by mass | 790 nm |
| L3 |  | 5.42 parts by mass | 847 nm |
| L4 |  | 5.20 parts by mass | 866 nm |
| L5 |  | 4.87 parts by mass | 911 nm |
| L6 |  | 4.65 parts by mass | 972 nm |
| L7 |  | 4.38 parts by mass | 1026 nm |
| L8 |  | 4.11 parts by mass | 1087 nm |

[Preparation of Laminated Cholesteric Reflecting Layer (CF1)]

Chloroform was applied to the prepared right circularly polarized light cholesteric layer (RF1) using a spin coating method, was heated on a hot plate at 80° C. for 1 minute, and a bashing treatment was performed thereon.

The coating solution (R2) was applied to the right circularly polarized light cholesteric layer (RF1) having undergone the bashing treatment using a spin coating method, was dried, and immobilized such that a coating film of the coating solution (R2) having a thickness of 5 µm was formed. Accordingly, the total thickness of the laminate including the right circularly polarized light cholesteric layer (RF1) was 10 µm.

The right circularly polarized light cholesteric layer (RF1) on which the coating film of the coating solution (R2) was formed was heated on a hot plate at 80° C. for 1 minute such that the solvent was dried and removed and a cholesteric aligned state was formed. Next, using EXECURE 3000-W (manufactured by HOYA-SCHOTT), the right circularly polarized light cholesteric layer (RF1) was irradiated UV light for 10 seconds at an illuminance of 30 mW/cm$^2$ at room temperature in a nitrogen atmosphere such that the alignment was immobilized. As a result, the right circularly polarized light cholesteric layer (RF2) was laminated on the right circularly polarized light cholesteric layer (RF1).

Hereinafter, the right circularly polarized light cholesteric layer (RF3) to the right circularly polarized light cholesteric layer (RF6) and the left circularly polarized light cholesteric layer (LF1) to the left circularly polarized light cholesteric layer (LF8) were sequentially laminated under the same conditions using the coating solution (R3) to the coating solution (R6) and the coating solution (L1) to the coating solution (L8), respectively. As a result, the laminated cholesteric reflecting layer (CF1) was prepared. The thickness of the prepared laminated cholesteric reflecting layer (CF1) was 70 µm.

Regarding the prepared laminated cholesteric reflecting layer (CF1), a transmittance of light in a wavelength range of 700 to 1000 nm was measured using a spectrophotometer (spectrophotometer UV-3100PC, manufactured by Shimadzu Corporation). As a result, the maximum transmittance of light in a wavelength of 700 to 1000 nm was 5%.

[Preparation of Laminated Cholesteric Reflecting Layer (CF2)]

A laminated cholesteric reflecting layer (CF2) was prepared under the same conditions as those of the laminated cholesteric reflecting layer (CF1), except that the two right circularly polarized light cholesteric layers (RF1) to the two right circularly polarized light cholesteric layer (RF6) and the two left circularly polarized light cholesteric layers (LF1) to the two left circularly polarized light cholesteric layers (LF8) were laminated in the step of preparing the laminated cholesteric reflecting layer (CF1). The thickness of the prepared laminated cholesteric reflecting layer (CF2) was 140 µm.

Regarding the prepared laminated cholesteric reflecting layer (CF2), the maximum transmittance of light in a wavelength range of 700 to 1000 nm was 1% in case of being measured under the same conditions as those of the laminated cholesteric reflecting layer (CF1).

[Preparation of Image Sensor 1]

A red filter (R), a green filter (G), and a blue filter (B) as absorbing color filters corresponding to respective solid image pickup elements were formed on a commercially available image sensor array using a well-known method, and a microlens was further laminated.

The laminated cholesteric reflecting layer (CF1) prepared as described above was bonded to the laminate using an adhesive such that the cholesteric layer faced the microlens side. As a result, an image sensor 1 was prepared. A gap between the absorbing color filter and the cholesteric layer was 100 µm or less.

That is, the image sensor 1 according to this example has the same configuration as the image sensor shown in FIG. 2, and the adhesive functions as a planarizing layer.

[Preparation of Image Sensor 2]

A red filter (R), a green filter (G), and a blue filter (B) as absorbing color filters corresponding to respective solid image pickup elements were formed on a commercially available image sensor array using a well-known method, and a microlens and a planarizing layer were further laminated.

A photo-aligned film was formed on the planarizing layer of the laminate under the same conditions as those of the glass substrate (P1) with the photo-aligned film.

The laminated cholesteric reflecting layer (CF2) was directly formed on the photo-aligned film using the above-described method. As a result, an image sensor 2 was prepared. A gap between the absorbing color filter and the cholesteric layer was 100 µm or less.

That is, the image sensor 2 according to this example also has the same configuration as the image sensor shown in FIG. 2.

EXPLANATION OF REFERENCES 10, 20, 30, 40: image sensor
12: sensor main body
12a: solid image pickup element
14: color filter
14R: red filter
14G: green filter
14B: blue filter
16: cholesteric reflecting layer
16r: right circularly polarized light cholesteric layer
16l: left circularly polarized light cholesteric layer
24: microlens
26: planarizing layer (bonding layer)
32: aligned cholesteric layer
34: infrared absorbing layer
36: antireflection layer
42: substrate

What is claimed is:

1. A color filter for an image sensor comprising:
   two or more absorbing color filters that absorb light components having different wavelength ranges;
   a cholesteric reflecting layer in which a right circularly polarized light cholesteric layer having right circularly polarized light reflecting properties and a left circularly polarized light cholesteric layer having left circularly polarized light reflecting properties are laminated; and
   a microlens provided between the absorbing color filters and the cholesteric reflecting layer;
   wherein a gap between the absorbing color filters and the cholesteric reflecting layer is 100 µm or less.

2. The color filter for an image sensor according to claim 1,
   wherein a planarizing layer that covers the microlens to planarize a surface of the microlens is provided between the microlens and the cholesteric layer.

3. The color filter for an image sensor according to claim 1, further comprising:
   a near infrared absorbing layer having absorption properties in a near infrared range.

4. The color filter for an image sensor according to claim 1,
   wherein an antireflection layer is provided at an interface in contact with air.

5. The color filter for an image sensor according to claim 1,
   wherein an aligned cholesteric layer is provided at an interface in contact with the cholesteric reflecting layer.

6. The color filter for an image sensor according to claim 5,
   wherein the aligned cholesteric layer is a photo-aligned film.

7. The color filter for an image sensor according to claim 1,
   wherein in a plane of the right circularly polarized light cholesteric layer and the left circularly polarized light cholesteric layer of the cholesteric reflecting layer, a plurality of reflecting regions that reflect light components having different wavelength ranges are provided, and reflecting regions that reflect light components having the same wavelength range are laminated at the same position in a plane direction.

8. The color filter for an image sensor according to claim 1,
   wherein the right circularly polarized light cholesteric layer and the left circularly polarized light cholesteric layer of the cholesteric reflecting layer are formed by curing a polymerizable cholesteric liquid crystal composition.

9. The color filter for an image sensor according to claim 8,
   wherein the polymerizable cholesteric liquid crystal composition includes at least one polymerizable liquid crystal having a refractive index anisotropy $\Delta n$ of 0.2 or higher, at least one chiral agent that induces right or left twisting, and a polymerization initiator.

10. The color filter for an image sensor according to claim 1, wherein a substrate is provided on a surface of the cholesteric reflecting layer opposite to the absorbing color filters.

11. An image sensor comprising:
the color filter for an image sensor according to claim 1; and
a sensor including solid image pickup elements that are arranged in a two-dimensional matrix.

12. A method of manufacturing a color filter for an image sensor, the method comprising:
a filter forming step of forming two or more absorbing color filters that absorb light components having different wavelength ranges on a sensor including solid image pickup elements that are arranged in a two-dimensional matrix;
after the filter forming step, a microlens forming step of forming a microlens corresponding to a pixel of the solid image pickup elements; and
a cholesteric reflecting layer forming step of forming a cholesteric reflecting layer in which a right circularly polarized light cholesteric layer having right circularly polarized light reflecting properties and a left circularly polarized light cholesteric layer having left circularly polarized light reflecting properties are laminated, the cholesteric reflecting layer forming step including a step of forming the right circularly polarized light cholesteric layer and a step of forming the left circularly polarized light cholesteric layer,
wherein in the cholesteric reflecting layer forming step, the cholesteric reflecting layer is formed such that a distance between the absorbing color filters and the cholesteric reflecting layer is 100 μm or less.

13. The method of manufacturing a color filter for an image sensor according to claim 12,
wherein a planarizing layer forming step of forming a planarizing layer that covers the microlens to planarize a surface of the microlens are provided after the microlens forming step.

14. The method of manufacturing a color filter for an image sensor according to claim 12,
wherein the step of forming the right circularly polarized light cholesteric layer in the cholesteric reflecting layer forming step includes a step of applying a polymerizable cholesteric liquid crystal composition including a chiral agent that induces right twisting, a step of heating the polymerizable cholesteric liquid crystal composition to form a cholesteric liquid crystalline phase having right circularly polarized light reflecting properties, and a step of exposing the cholesteric liquid crystalline phase to ultraviolet light to immobilize the cholesteric liquid crystalline phase, and
the step of forming the left circularly polarized light cholesteric layer in the cholesteric reflecting layer forming step includes a step of applying a polymerizable cholesteric liquid crystal composition including a chiral agent that induces left twisting, a step of heating the polymerizable cholesteric liquid crystal composition to form a cholesteric liquid crystalline phase having left circularly polarized light reflecting properties, and a step of exposing the cholesteric liquid crystalline phase to ultraviolet light to immobilize the cholesteric liquid crystalline phase.

15. The method of manufacturing a color filter for an image sensor according to claim 12, further comprising:
an aligned layer forming step of forming an aligned cholesteric layer on a surface on which the cholesteric reflecting layer is to be formed.

16. The method of manufacturing a color filter for an image sensor according to claim 12,
wherein an antireflection layer forming step of forming an antireflection layer is provided after the cholesteric reflecting layer forming step.

17. The method of manufacturing a color filter for an image sensor according to claim 12,
wherein an infrared absorbing layer forming step of forming a near infrared absorbing layer having absorption properties in a near infrared range is provided after the filter forming step.

18. The method of manufacturing a color filter for an image sensor according to claim 12,
wherein before at least one forming step among the respective forming steps, at least one treatment step among a bashing treatment step of performing a bashing treatment on a surface on which the forming step is to be performed using an organic solvent, a plasma treatment step of performing a plasma treatment on a surface on which the forming step is to be performed, and a saponification treatment step of performing a saponification treatment on a surface on which the forming step is to be performed using an alkaline solution is performed.

19. A method of manufacturing a color filter for an image sensor, the method comprising:
a filter forming step of forming two or more absorbing color filters that absorb light components having different wavelength ranges on a sensor including solid image pickup elements that are arranged in a two-dimensional matrix;
after the filter forming step, a microlens forming step of forming a microlens corresponding to a pixel of the solid image pickup elements; and
a cholesteric reflecting layer forming step of forming a cholesteric reflecting layer in which a right circularly polarized light cholesteric layer having right circularly polarized light reflecting properties and a left circularly polarized light cholesteric layer having left circularly polarized light reflecting properties are laminated on one surface of a substrate; and
a bonding step of laminating and bonding the sensor and the substrate to each other such that the absorbing color filters and the cholesteric reflecting layer face each other,
wherein in the bonding step, the solid image pickup element and the substrate are bonded to each other such that a distance between the cholesteric reflecting layer and the absorbing color filters is 100 μm or less.

20. The method of manufacturing a color filter for an image sensor according to claim 19,
wherein a removing step of removing the substrate is provided after the bonding step.

* * * * *